(12) United States Patent
Akimoto et al.

(10) Patent No.: US 8,319,216 B2
(45) Date of Patent: Nov. 27, 2012

(54) SEMICONDUCTOR DEVICE AND METHOD FOR MANUFACTURING THE SEMICONDUCTOR DEVICE

(75) Inventors: Kengo Akimoto, Atsugi (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 533 days.

(21) Appl. No.: 12/612,711

(22) Filed: Nov. 5, 2009

(65) Prior Publication Data

US 2010/0117076 A1 May 13, 2010

(30) Foreign Application Priority Data

Nov. 7, 2008 (JP) .................. 2008-286577

(51) Int. Cl.
*H01L 29/10* (2006.01)
(52) U.S. Cl. .............. 257/43; 257/57; 257/E29.291; 257/E29.068
(58) Field of Classification Search .......... 257/43, 257/57, E29.291, E29.068; 438/161
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,847,410 A | 12/1998 | Nakajima |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |

(Continued)

FOREIGN PATENT DOCUMENTS

EP 1737044 A 12/2006

(Continued)

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(Continued)

*Primary Examiner* — Kevin M Picardat
*Assistant Examiner* — Paul Patton
(74) *Attorney, Agent, or Firm* — Eric J. Robinson; Robinson Intellectual Property Law Office, P.C.

(57) ABSTRACT

It is disclosed that a semiconductor device includes an oxide semiconductor layer provided over a gate insulating layer, a source electrode layer, and a drain electrode layer, in which a thickness of the gate insulating layer located in a region between the source electrode layer and the drain electrode layer is smaller than a thickness of the gate insulating layer provided between the gate electrode layer and at least one of the source electrode layer and the drain electrode layer.

22 Claims, 26 Drawing Sheets

U.S. PATENT DOCUMENTS

| | | | |
|---|---|---|---|
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0117719 | A1* | 8/2002 | Ando et al. ............ 257/347 |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0203387 | A1 | 8/2008 | Kang et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0065771 | A1 | 3/2009 | Iwasaki et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0025678 | A1 | 2/2010 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-096055 A | 4/2007 |
| JP | 2007-123861 A | 5/2007 |
| JP | 2007-250983 A | 9/2007 |
| JP | 2007-305658 A | 11/2007 |
| WO | WO-2004/114391 | 12/2004 |
| WO | WO-2007/119386 | 10/2007 |

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by PEALD Grown ZnO TFT,", IMID '07 Digest, 2007, p. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,$YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure,", IEDM 09: Technical Digest of International Electron Devices Meeting, Dec. 7, 2009, pp. 191-194.

Nakamura. M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

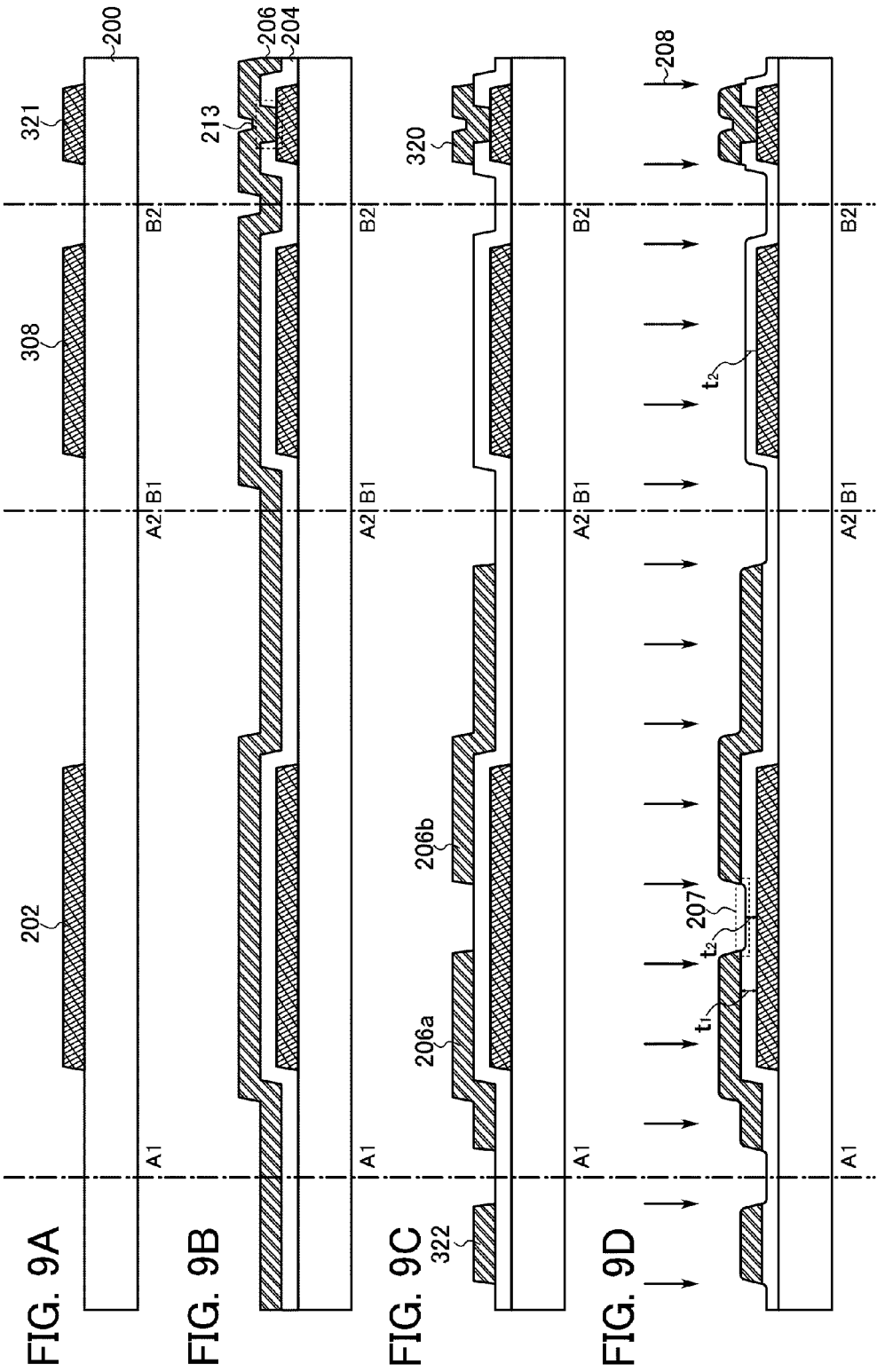

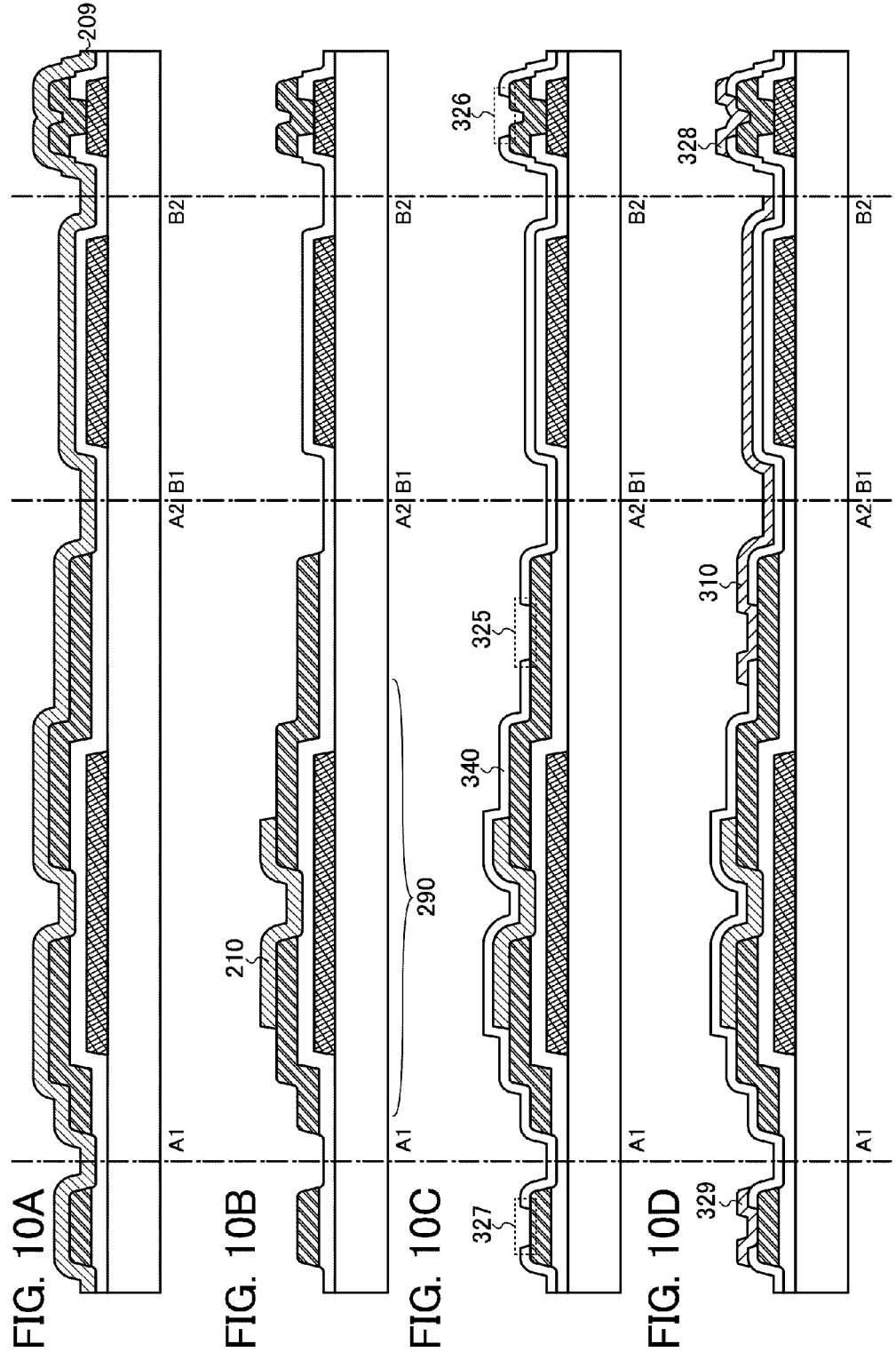

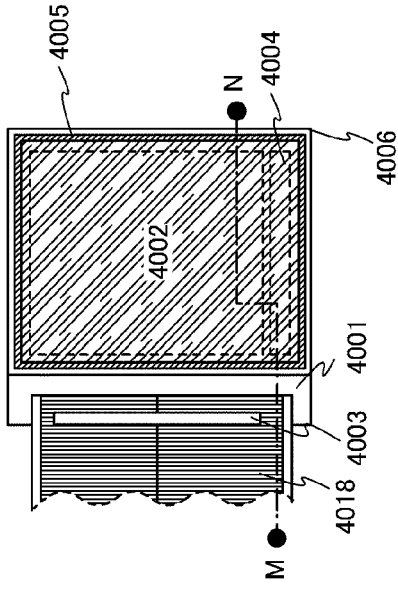
FIG. 16A1
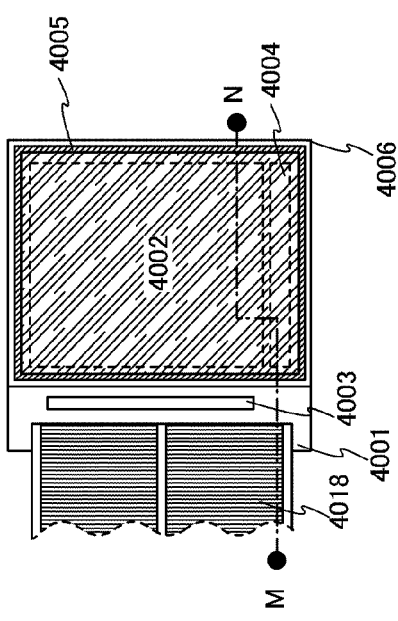
FIG. 16A2
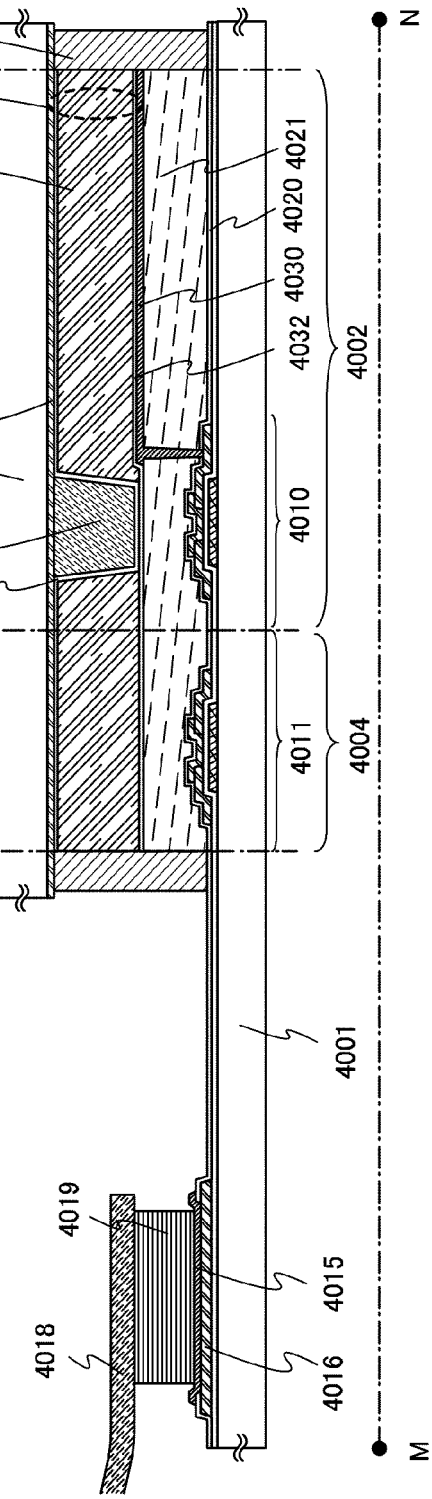
FIG. 16B

SEMICONDUCTOR DEVICE AND METHOD FOR MANUFACTURING THE SEMICONDUCTOR DEVICE

BACKGROUND OF THE INVENTION

1. Field of the Invention

The present invention relates to a semiconductor device and a method for manufacturing the semiconductor device.

2. Description of the Related Art

In recent years, a technique in which a thin film transistor (also referred to as a TFT) is formed using an oxide semiconductor and is applied to an electronic device and the like has attracted attention. For example, a technique in which a switching element and the like of an image display device are formed using zinc oxide, an In—Ga—Zn—O-based oxide semiconductor, or the like as an oxide semiconductor layer is disclosed in Reference 1 and Reference 2.

In addition, as a structure of a transistor using an oxide semiconductor layer, various structures are proposed. For example, a bottom-gate bottom-contact structure, in which an oxide semiconductor layer is formed over a source electrode layer and a drain electrode layer which are provided over a gate insulating layer, is disclosed in Reference 2 and Reference 3.

REFERENCES

Reference 1: Japanese Published Patent Application No. 2007-123861
Reference 2: Japanese Published Patent Application No. 2007-96055
Reference 3: Japanese Published Patent Application No. 2007-305658

In general, in order to reduce a driving voltage of a transistor and perform a high speed operation, a decrease in the thickness of a gate insulating layer has an advantageous effect. However, when part of a gate electrode layer overlaps with parts of a source electrode layer and a drain electrode layer with a gate insulating layer interposed therebetween in a bottom-gate bottom-contact structure, as the thickness of the gate insulating layer is reduced, parasitic capacitance might be formed between the gate electrode layer and the source or drain electrode layer, which might affect element characteristics. As a result, variation in the element characteristics might occur and reliability of an element might be decreased.

When a source electrode layer and a drain electrode layer are provided to cover an end portion of a gate electrode layer with a gate insulating layer interposed therebetween, as the thickness of the gate insulating layer which covers the end portion of the gate electrode layer is reduced, there arises a problem in that leakage easily occurs between the gate electrode layer and the source electrode layer or the drain electrode layer.

In view of the foregoing problem, an object is to improve element characteristics and reliability of an element even when a semiconductor layer is provided over a gate electrode layer, a source electrode layer, and a drain electrode layer.

SUMMARY OF THE INVENTION

A structure has a gate electrode layer; a gate insulating layer provided over the gate electrode layer; a source electrode layer and a drain electrode layer which are provided so as to overlap with part of the gate electrode layer with the gate insulating layer interposed therebetween; and a semiconductor layer provided over the gate insulating layer, the source electrode layer, and the drain electrode layer. In the structure, the thickness of the gate insulating layer located in a region between the source electrode layer and the drain electrode layer becomes smaller than the thickness of the gate insulating layer provided between the gate electrode layer and at least one of the source electrode layer and the drain electrode layer. In this case, parasitic capacitance generated between the source or drain electrode layer and the gate electrode layer can be reduced, and element characteristics can be improved.

According to one mode of the present invention disclosed herein, a semiconductor device includes: a gate electrode layer provided over a substrate; a gate insulating layer provided over the gate electrode layer; a source electrode layer and a drain electrode layer which are provided to overlap with part of the gate electrode layer with the gate insulating layer interposed therebetween; and an oxide semiconductor layer which is over the gate electrode layer and is provided in contact with the gate insulating layer located in a region between the source electrode layer and the drain electrode layer and is provided over the source electrode layer and the drain electrode layer. A thickness of the gate insulating layer which is over the gate electrode layer and is located in the region between the source electrode layer and the drain electrode layer is smaller than a thickness of the gate insulating layer provided between the gate electrode layer and at least one of the source electrode layer and the drain electrode layer.

According to one mode of the present invention disclosed herein, a semiconductor device includes: a gate electrode layer provided over a substrate; a first insulating layer provided over the gate electrode layer; a second insulating layer which is over the first insulating layer and is provided to overlap with part of the gate electrode layer; a source electrode layer and a drain electrode layer which are provided to overlap with the part of the gate electrode layer with the first insulating layer and the second insulating layer interposed therebetween; and an oxide semiconductor layer which is over the gate electrode layer and is in contact with the first insulating layer located in a region between the source electrode layer and the drain electrode layer and is provided over the source electrode layer and the drain electrode layer. Note that a thickness of the first insulating layer which is over the gate electrode layer and is located in the region between the source electrode layer and the drain electrode layer may be smaller than a thickness of the first insulating layer provided between the gate electrode layer and at least one of the source electrode layer and the drain electrode layer.

According to one mode of the present invention disclosed herein, a semiconductor device includes: a gate electrode layer provided over a substrate; a first insulating layer and a second insulating layer which are sequentially stacked over the gate electrode layer; a source electrode layer and a drain electrode layer which are provided to overlap with part of the gate electrode layer with the first insulating layer and the second insulating layer interposed therebetween; and an oxide semiconductor layer which is over the gate electrode layer and is provided in contact with the second insulating layer located in a region between the source electrode layer and the drain electrode layer and is provided over the source electrode layer and the drain electrode layer. A thickness of the second insulating layer which is over the gate electrode layer and is located in the region between the source electrode layer and the drain electrode layer is smaller than a thickness of the second insulating layer provided between the gate electrode layer and at least one of the source electrode layer and the drain electrode layer.

According to one mode of the present invention disclosed herein, a method for manufacturing a semiconductor device includes the following steps: a gate electrode layer is formed over a substrate; a gate insulating layer is formed over the gate electrode layer; a source electrode layer and a drain electrode layer are formed over the gate insulating layer; an upper layer portion of the gate insulating layer provided in a region between the source electrode layer and the drain electrode layer is etched, so that a thickness of the gate insulating layer which is located in the region between the source electrode layer and the drain electrode layer is smaller than a thickness of the gate insulating layer provided between the gate electrode layer and at least one of the source electrode layer and the drain electrode layer; and an oxide semiconductor layer is formed over the gate insulating layer, the source electrode layer, and the drain electrode layer.

According to one mode of the present invention disclosed herein, a method for manufacturing a semiconductor device includes the following steps: a gate electrode layer is formed over a substrate; a first insulating layer is formed over the gate electrode layer; a second insulating layer is formed over the first insulating layer; a source electrode layer and a drain electrode layer are formed over the second insulating layer; the second insulating layer provided in a region between the source electrode layer and the drain electrode layer is etched to expose the first insulating layer; and an oxide semiconductor layer is formed over the first insulating layer, the source electrode layer, and the drain electrode layer.

Note that as an example of the oxide semiconductor which can be used in this specification, there is an oxide semiconductor represented by $InMO_3(ZnO)_m$ (m>0, m is not an integer). Here, M denotes one or more metal elements selected from gallium (Ga), iron (Fe), nickel (Ni), manganese (Mn), and cobalt (Co). For example, the case where Ga is selected as M includes the case where the aforementioned metal element other than Ga is selected such as a combination of Ga and Ni, or a combination of Ga and Fe as well as the case where only Ga is used. In the above oxide semiconductor, there is an oxide semiconductor which includes a transition metal element such as Fe, Ni, or the like, or oxide of the transition metal as an impurity element, in addition to the metal element included as M. In this specification, of the above oxide semiconductors, an oxide semiconductor at least including gallium as M is referred to as an In—Ga—Zn—O-based oxide semiconductor, and a thin film using the material is referred to as an In—Ga—Zn—O-based non-single-crystal film.

Note that a semiconductor device in this specification refers to all devices which can function by utilizing semiconductor characteristics, and electro-optical devices, semiconductor circuits, and electronic devices are all included in the category of the semiconductor device. In addition, in this specification, a display device includes a light-emitting device and a liquid crystal display device. The light-emitting device includes a light-emitting element, and the liquid crystal display device includes a liquid crystal element. The light-emitting element refers to an element, luminance of which is controlled by a current or a voltage. Specifically, the light-emitting element refers to an inorganic EL (electroluminescence) element, an organic EL element, and the like.

In the structure having a gate electrode layer; a gate insulating layer provided over the gate electrode layer; a source electrode layer and a drain electrode layer which are provided so as to overlap with part of the gate electrode layer with the gate insulating layer interposed therebetween; and a semiconductor layer provided over the gate insulating layer, the source electrode layer, and the drain electrode layer, the thickness of the gate insulating layer located in a region between the source electrode layer and the drain electrode layer becomes smaller than the thickness of the gate insulating layer provided between the gate electrode layer and at least one of the source electrode layer and the drain electrode layer. Accordingly, parasitic capacitance generated between the source or drain electrode layer and the gate electrode layer can be reduced, and element characteristics can be improved.

BRIEF DESCRIPTION OF THE DRAWINGS

FIGS. 9A to 9D are views illustrating an example of a method for manufacturing a semiconductor device according to Embodiment 5.

FIGS. 10A to 10D are views illustrating an example of the method for manufacturing a semiconductor device according to Embodiment 5.

FIGS. 16A1, 16A2, and 16B are views each illustrating an example of a semiconductor device according to Embodiment 6.

DETAILED DESCRIPTION OF THE INVENTION

Figure 1A:
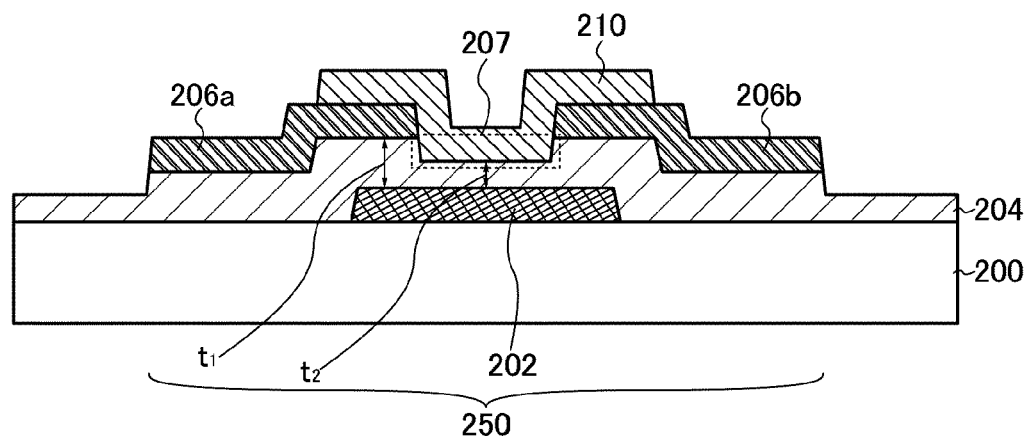
FIGS. 1A and 1B are views each illustrating an example of a semiconductor device according to Embodiment 1 or Embodiment 2.

Embodiments will be described with reference to the drawings. It is easily understood by those skilled in the art that the present invention can be carried out in many different modes, and modes and details disclosed herein can be modified in various ways without departing from the spirit and scope of the present invention. Therefore, the present invention is not construed as being limited to the description of the Embodiments. Further, structures according to different embodiments can be carried out with appropriate combination. In structures of the present invention described below, the same reference numeral is given to the same parts or parts having similar functions, and repeated description thereof is omitted.

Embodiment 1

First, a structure of a thin film transistor described in this embodiment will be described with reference to FIG. 1A.

A thin film transistor 250 described in this embodiment includes a gate electrode layer 202 provided over a substrate 200, a gate insulating layer 204 provided over the gate electrode layer 202 and the substrate 200, a source electrode layer 206a and a drain electrode layer 206b provided over the gate insulating layer 204, and an oxide semiconductor layer 210 which is provided over the source electrode layer 206a and the drain electrode layer 206b and is provided in contact with the gate insulating layer 204 located between the source electrode layer 206a and the drain electrode layer 206b. Further, the source electrode layer 206a and the drain electrode layer 206b are provided to overlap with part of the gate electrode layer 202 with the gate insulating layer 204 interposed therebetween. A thickness $t_2$ of the gate insulating layer 204 which is located in a region between the source electrode layer 206a and the drain electrode layer 206b is smaller than a thickness $t_1$ of the gate insulating layer 204 provided between the gate electrode layer 202 and the source electrode layer 206a or the gate insulating layer 204 provided between the gate electrode layer 202 and the drain electrode layer 206b (see FIG. 1A).

That is, the gate insulating layer 204 has a depression portion (dent (hereinafter referred to as a "depression portion 207") in a region where the gate insulating layer 204 overlaps with the gate electrode layer 202, and the oxide semiconductor layer 210 is provided in the depression portion 207 of the gate insulating layer 204. Note that the depression portion 207 of the gate insulating layer 204 here refers to a dent formed in the gate insulating layer 204 when observed from the cross-sectional direction along a line connecting the source electrode layer with the drain electrode layer are.

In this manner, with the structure illustrated in FIG. 1A, even when the source electrode layer 206a and the drain electrode layer 206b are provided over the gate electrode layer 202 with the gate insulating layer 204 interposed therebetween so that parts of the source electrode layer 206a and the drain electrode layer 206b overlap with the gate electrode layer 202 and the oxide semiconductor layer 210 is provided over the source electrode layer 206a and the drain electrode layer 206b, a driving voltage of a transistor can be reduced and element characteristics can be improved and parasitic capacitance generated between the source electrode layer 206a and the gate electrode layer 202 or between the drain electrode layer 206b and the gate electrode layer 202 can be reduced.

Note that in FIG. 1A, the case where both the source electrode layer 206a and the drain electrode layer 206b overlap with part of the gate electrode layer 202 with the gate insulating layer 204 interposed therebetween is described; however, this embodiment is not limited thereto. When either the source electrode layer 206a or the drain electrode layer 206b overlaps with the gate electrode layer 202 with the gate insulating layer 204 interposed therebetween, the thickness $t_1$ of the gate insulating layer 204 provided between the overlapped electrode layer and the gate electrode layer 202 may become larger than the thickness $t_2$ of the gate insulating layer 204 located in a region between the source electrode layer 206a and the drain electrode layer 206b.

Next, with reference to FIGS. 2A to 2E, one mode of a method for manufacturing the thin film transistor 250 illustrated in FIG. 1A is described.

Figure 2A:
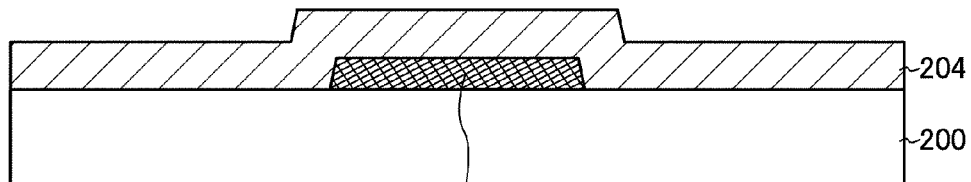
FIGS. 2A to 2E are views illustrating an example of a method for manufacturing a semiconductor device according to Embodiment 1.

First, the gate electrode layer 202 is formed over the substrate 200, and then the gate insulating layer 204 is formed over the gate electrode layer 202 (see FIG. 2A).

As the substrate 200, a substrate having an insulating surface may be used, and for example, a glass substrate can be used. Further, a non-alkali glass substrate is preferable as the glass substrate. As a material of the non-alkali glass substrate, a glass material such as aluminosilicate glass, aluminoborosilicate glass, or barium borosilicate glass is used, for example. In addition, as the substrate 200, an insulating substrate formed using an insulator such as a ceramic substrate, a quartz substrate, or a sapphire substrate; a semiconductor substrate which is formed using a semiconductor material such as silicon and whose surface is covered with an insulating material; or a conductive substrate which is formed using a conductor such as metal or stainless steel and whose surface is covered with an insulating material can be used. In addition, a plastic substrate can be used as long as it can withstand heat treatment in a manufacturing process.

After a conductive layer is formed over an entire surface of the substrate 200, the conductive layer is etched by a photolithography method, whereby the gate electrode layer 202 can be formed. The gate electrode layer 202 includes an electrode and a wiring which are formed by the conductive layer such as a gate wiring.

The gate electrode layer 202 is preferably formed using a conductive material such as aluminum (Al), copper (Cu), molybdenum (Mo), tungsten (W), or titanium (Ti). Note that when aluminum is used by itself for the wiring or the electrode, there are problems in that aluminum has low heat resistance and that aluminum is easily eroded, for example. Therefore, it is preferable to use aluminum in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc); an alloy containing the above element as its component; an alloy containing a combination of the above elements; or nitride containing the above element as its component may be used. A film formed using any of these heat-resistant conductive materials and an aluminum (or copper) film may be stacked, so that the wiring and the electrode may be formed.

Note that the gate electrode layer 202 can be selectively formed over the substrate 200 by a droplet discharge method, a screen printing method, or the like.

The gate insulating layer 204 can be formed using a silicon oxide film, a silicon oxynitride film, a silicon nitride film, a silicon nitride oxide film, an aluminum oxide film, a tantalum oxide film, or the like. In addition, any of these films may be stacked. The total thickness of these films can be greater than or equal to 50 nm and less than or equal to 250 nm by a sputtering method or the like. For example, as the gate insulating layer 204, a silicon oxide film can be formed to a thickness of 200 nm by a sputtering method.

In this specification, silicon oxynitride means a substance which contains more oxygen than nitrogen and, in the case where measurements are performed by Rutherford backscattering spectrometry (RBS) and hydrogen forward scattering spectrometry (HFS), preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Figure 2B:
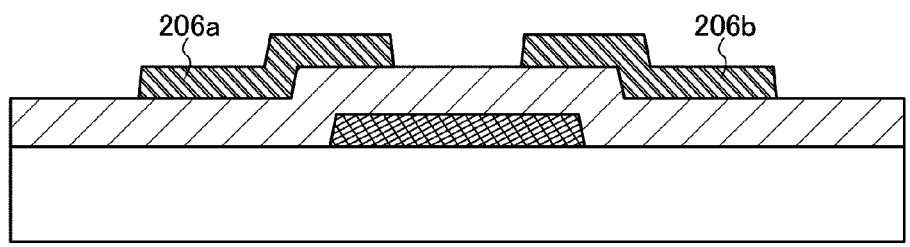

Next, the source electrode layer 206a and the drain electrode layer 206b are formed over the gate insulating layer 204 (see FIG. 2B).

After a conductive layer is formed over the gate insulating layer 204, the conductive layer is etched by a photolithography method, whereby the source electrode layer 206a and the drain electrode layer 206b can be formed. Here, the case where the source electrode layer 206a and the drain electrode layer 206b partly overlap with the gate electrode layer 202 with the gate insulating layer 204 interposed therebetween is described as an example.

The source electrode layer 206a and the drain electrode layer 206b can be formed by a sputtering method, a vacuum evaporation method, or the like using metal including an element selected from aluminum (Al), copper (Cu), titanium (Ti), tantalum (Ta), tungsten (W), molybdenum (Mo), chromium (Cr), neodymium (Nd), and scandium (Sc); an alloy including the above element as a component; or a material including nitride or the like in which the above element is a component.

For example, the source electrode layer 206a and the drain electrode layer 206b can be formed to have a single-layer structure of a molybdenum film or a titanium film. The source electrode layer 206a and the drain electrode layer 206b may be formed to have a stacked structure, for example, a stacked structure of an aluminum film and a titanium film. A three-layer structure in which a titanium film, an aluminum film, and a titanium film are sequentially stacked may be used. A three-layer structure in which a molybdenum film, an aluminum film, and a molybdenum film are sequentially stacked may be used. As the aluminum films used for these stacked structures, an aluminum film including neodymium (Al—Nd) may be used. The source electrode layer 206a and the drain electrode layer 206b may have a single-layer structure of an aluminum film including silicon.

Note that the source electrode layer 206a and the drain electrode layer 206b can be selectively formed over the substrate 200 by a droplet discharge method, a screen printing method, or the like.

The source electrode layer 206a formed in FIG. 2B functions as a source of a transistor, and the drain electrode layer 206b functions as a drain of the transistor. Note that depending on a driving method of the transistor, the source electrode layer 206a functions as a drain, and the drain electrode layer 206b functions as a source.

Figure 2C:
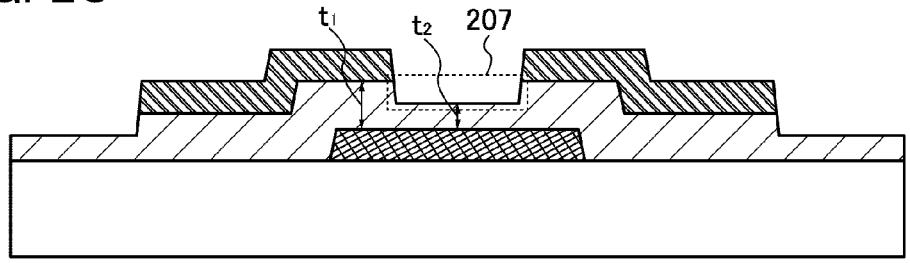

Next, an upper layer portion of the gate insulating layer 204 (the exposed gate insulating layer 204) provided in the region between the source electrode layer 206a and the drain electrode layer 206b is subjected to etching treatment, whereby the depression portion 207 is formed in the gate insulating layer 204 (see FIG. 2C).

By the etching treatment, the thickness $t_2$ of the gate insulating layer 204 located in the region between the source electrode layer 206a and the drain electrode layer 206b can become smaller than the thickness $t_1$ of the gate insulating layer 204 provided between the gate electrode layer 202 and the source electrode layer 206a or the gate insulating layer 204 provided between the gate electrode layer 202 and the drain electrode layer 206b. It is preferable that the thickness $t_2$ of the gate insulating layer 204 be ⅕ to ⅘ ($t_2=t_1/5$ to $4t_1/5$) of the thickness $t_1$.

As the etching treatment, plasma treatment using an inert gas and/or a reactive gas, a wet etching process, or the like can be used.

In the etching treatment, the source electrode layer 206a and the drain electrode layer 206b can be used as masks. Alternatively, the gate insulating layer 204 can be etched utilizing a photomask which is used when the source electrode layer 206a and the drain electrode layer 206b are formed (FIG. 2B). In this case, the gate insulating layer 204 which does not overlap with the source electrode layer 206a and the drain electrode layer 206b is etched.

The etching treatment is performed, whereby impurities attached to the exposed surface of the gate insulating layer 204 and a surface portion where an impurity element is taken can be removed and the thickness of the gate insulating layer 204 can vary in each region (see FIG. 2C).

Figure 2D:
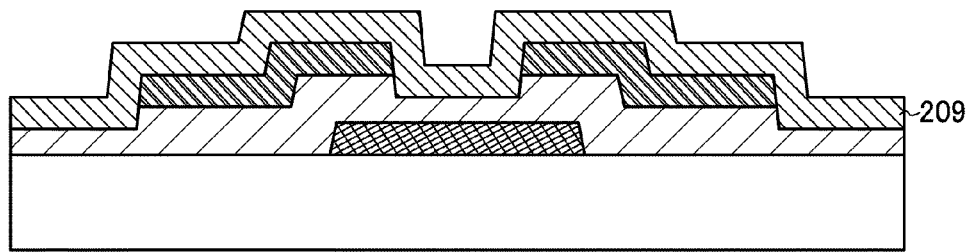

Next, an oxide semiconductor layer 209 is formed to cover the gate insulating layer 204, the source electrode layer 206a, and the drain electrode layer 206b (see FIG. 2D).

The oxide semiconductor layer 209 can be formed using an In—Ga—Zn—O-based non-single-crystal film. For example, the oxide semiconductor layer 209 can be formed by a sputtering method using an oxide semiconductor target including In, Ga, and Zn ($In_2O_3:Ga_2O_3:ZnO=1:1:1$). The condition of sputtering can be set as follows: the distance between the substrate 200 and the target is 30 mm to 500 mm, the pressure is 0.1 Pa to 2.0 Pa, the direct current (DC) power supply is 0.25 kW to 5.0 kW, the temperature is 20° C. to 100° C., the atmosphere is an argon atmosphere, an oxygen atmosphere, or a mixture atmosphere of argon and oxygen, for example.

Note that when a pulsed direct current (DC) power supply is used, dust can be reduced and thickness distribution becomes uniform, which is preferable. In the case where the oxide semiconductor layer 209 is formed without being exposed to air after the above plasma treatment, attachment of dust or moisture to the interface between the gate insulating layer 204 and the oxide semiconductor layer 209 can be suppressed. In addition, the oxide semiconductor layer 209 may have a thickness of approximately 5 nm to 200 nm.

As the above sputtering method, an RF sputtering method using a high frequency power supply for a power supply for sputtering, a DC sputtering method using a DC power supply, a pulsed DC sputtering method in which a DC bias is applied in a pulse manner, or the like can be employed.

In addition, it is preferable that when the plasma treatment is used as the etching treatment, the plasma treatment and formation of the oxide semiconductor layer 209 be performed in the same chamber in succession. The oxide semiconductor layer 209 is formed without exposure of the surfaces of the gate insulating layer 204, the source electrode layer 206a, and the drain electrode layer 206b after the plasma treatment to air, whereby attachment of impurities to the surfaces of the gate insulating layer 204, the source electrode layer 206a, and the drain electrode layer 206b and formation of an oxide film or the like on the surfaces of the gate insulating layer 204, the source electrode layer 206a, and the drain electrode layer 206b can be suppressed.

Note that in this embodiment, the case where an oxide semiconductor layer is used as a semiconductor layer to serve as a channel formation region of the thin film transistor 250 is described; however a semiconductor layer that can be used is not limited thereto. Alternatively, a semiconductor layer using an organic semiconductor material or the like can be used as a semiconductor layer. Further alternatively, in place of the In—Ga—Zn—O-based non-single-crystal film, an oxide semiconductor comprising at least one selected from indium, gallium, and zinc such as ZnO, IZO, and ITO, an oxide semiconductor such as SnO, or a compound semiconductor such as SiGe and GaAs may be used as a semiconductor layer.

Figure 2E:
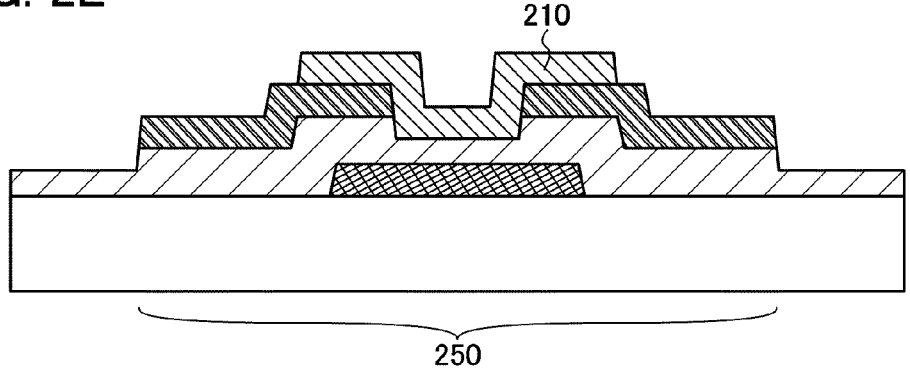

Next, the oxide semiconductor layer 209 is etched to form the island-shaped oxide semiconductor layer 210 (see FIG. 2E).

Through the above-described steps, the thin film transistor 250 in which the oxide semiconductor layer 210 is used as a channel formation region can be formed.

In addition, after the oxide semiconductor layer 210 is formed, heat treatment is preferably performed at 100° C. to 600° C., typically, 200° C. to 400° C. For example, heat treatment can be performed under a nitrogen atmosphere at 350° C. for one hour. By this heat treatment, rearrangement of the In—Ga—Zn—O-based oxide semiconductor for forming the island-shaped oxide semiconductor layer 210 is performed at the atomic level. This heat treatment (including light annealing and the like) is important in terms of reduction of distortion which hinders the transfer of carriers in the island-shaped oxide semiconductor layer 210. Note that the timing of the above heat treatment is not particularly limited as long as it is after the formation of the oxide semiconductor layer 209.

Further, oxygen radical treatment may be performed on the island-shaped oxide semiconductor layer 210. When the oxygen radical treatment is performed, a thin film transistor in which the oxide semiconductor layer 210 serves as the channel formation region can be a normally-off type. In addition, when radical treatment is performed, damage of the island-shaped oxide semiconductor layer 210 due to etching can be repaired. The radical treatment can be performed under an atmosphere of $O_2$, $N_2O$, $N_2$ including oxygen, He including oxygen, Ar including oxygen, or the like. Further, the radical treatment may be performed under the above atmosphere to which $Cl_2$ and/or $CF_4$ are/is added. Note that the radical treatment is preferably performed without a bias voltage being applied to the substrate 200 side.

A protective insulating layer may be formed so as to cover the thin film transistor 250 including the oxide semiconductor layer 210, the source electrode layer 206a, the drain electrode layer 206b, and the like. As the protective insulating layer, a single layer or a stacked layer of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a CVD method, a sputtering method, or the like.

Then, various electrodes and wirings are formed, whereby a semiconductor device which includes the thin film transistor 250 is completed.

As described above, after the source electrode layer 206a and the drain electrode layer 206b are formed, the exposed gate insulating layer 204 is subjected to the etching treatment, whereby the thickness $t_2$ of the gate insulating layer 204 located between the source electrode layer 206a and the drain electrode layer 206b can become smaller than the thickness $t_1$ of the gate insulating layer 204 provided between the gate electrode layer 202 and the source electrode layer 206a or the gate insulating layer 204 provided between the gate electrode layer 202 and the drain electrode layer 206b. As a result, element characteristics can be improved and the parasitic capacitance generated between the source or drain electrode layer and the gate electrode layer can be reduced.

Embodiment 2

In this embodiment, a structure of a transistor which is different from that described in the above embodiment will be described with reference to FIG. 1B.

Figure 1B:
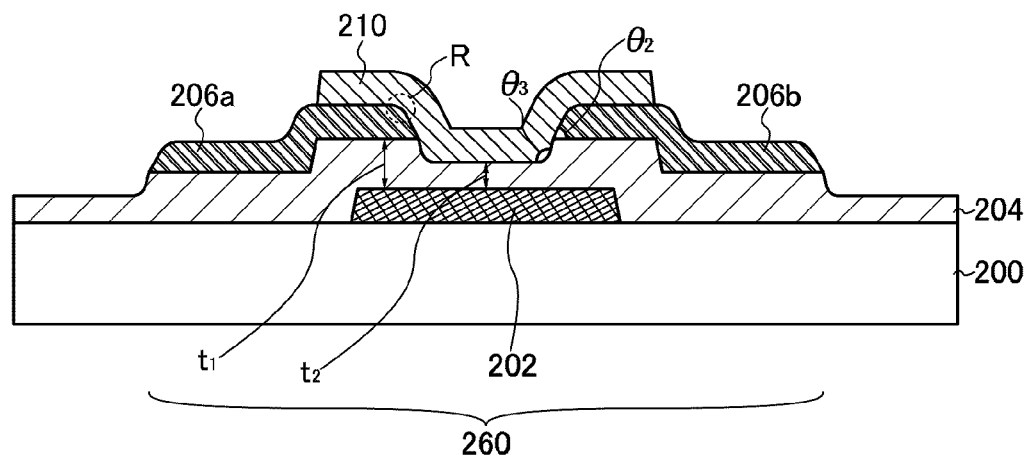

A thin film transistor 260 illustrated in FIG. 1B is formed in such a manner that the source electrode layer 206a and the drain electrode layer 206b of the thin film transistor 250 illustrated in FIG. 1A have tapered shapes and the upper end portions of the source electrode layer 206a and the drain electrode layer 206b have curved surfaces. Note that the other structure (positional relationship among the gate electrode layer 202, the gate insulating layer 204, the source electrode layer 206a, the drain electrode layer 206b, and the oxide semiconductor layer 210, or the like) can be formed in a manner similar to that in FIG. 1A.

The source electrode layer 206a and the drain electrode layer 206b have tapered shapes and the upper end portions of the source electrode layer 206a and the drain electrode layer 206b have curved surfaces, whereby the coverage of the oxide semiconductor layer 210 with respect to the gate insulating layer 204, the source electrode layer 206a, and the drain electrode layer 206b can be improved and disconnection can be suppressed. In particular, even when the thickness $t_2$ of the gate insulating layer 204 located in a region between the source electrode layer 206a and the drain electrode layer 206b becomes sufficiently smaller than the thickness $t_1$ of the gate insulating layer provided below the source electrode layer 206a and the drain electrode layer 206b, disconnection of the oxide semiconductor layer 210 can be suppressed effectively.

An example of a method for manufacturing the thin film transistor 260 illustrated in FIG. 1B is described with reference to FIGS. 3A to 3D. Note that many portions in the manufacturing process in FIGS. 3A to 3D are common with those in FIG. 1B. Therefore, in the following description, repeated description of the same portions is omitted, and different points are described in detail. In addition, in FIGS. 3A to 3D, the case where plasma treatment is used as etching treatment of the gate insulating layer 204 is illustrated.

Figure 3A:
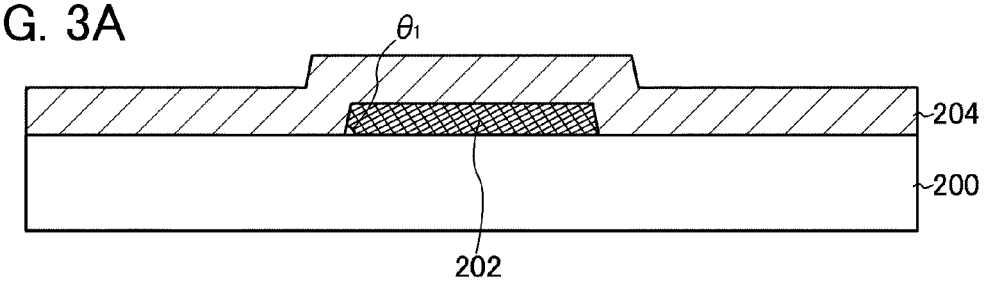
FIGS. 3A to 3D are views illustrating an example of a method for manufacturing a semiconductor device according to Embodiment 2.

First, the gate electrode layer 202 is formed over the substrate 200 having an insulating surface, and then the gate insulating layer 204 is formed over the gate electrode layer 202 (see FIG. 3A). When the gate electrode layer 202 is formed, the end portion of the gate electrode layer 202 is preferably etched into a tapered shape in order to improve coverage of the gate insulating layer 204 to be formed later and to prevent disconnection. For example, it is preferable that a taper angle $\theta_1$ be greater than or equal to 20° and less than 90°, more preferably, greater than or equal to 30° and less than or equal to 80°. Note that "the taper angle $\theta_1$" refers to an inclination angle inside a layer that is tapered (here, the gate electrode layer 202), which is formed by the side surface of the layer and the bottom surface thereof when the layer is observed from a cross-sectional direction (plane which is perpendicular to the surface of the substrate 200). That is, the taper angle $\theta_1$ corresponds to an angle of the lower end portion of the gate electrode layer 202 which is in contact with the substrate 200 when observed from the cross-sectional direction.

For materials and manufacturing methods of the gate electrode layer 202 and the gate insulating layer 204, refer to Embodiment 1.

Figure 3B:
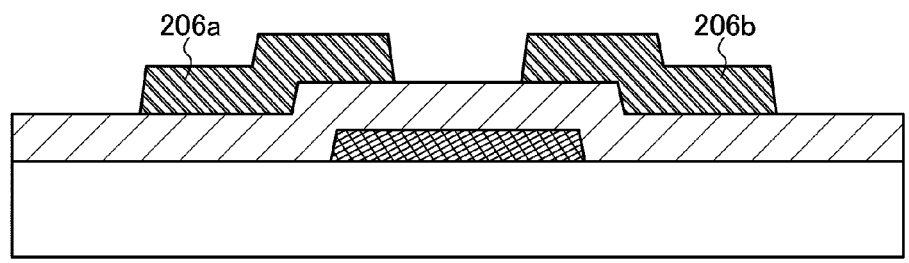
Figure 3C:
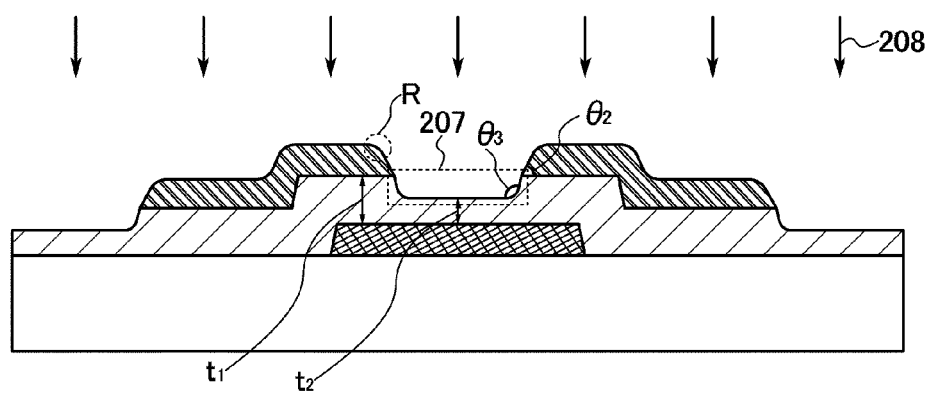

Next, the source electrode layer 206a and the drain electrode layer 206b are formed over the gate insulating layer 204 (see FIG. 3B). For a material and a manufacturing method of the source electrode layer 206a and the drain electrode layer 206b, refer to Embodiment 1.

Next, etching treatment is performed on the gate insulating layer 204. Here, the case is described in which plasma is generated in the chamber in which the substrate 200 is placed, plasma 208 acts on the surfaces of the exposed gate insulating layer 204, the source electrode layer 206a, and the drain electrode layer 206b so that the depression portion 207 is formed in the gate insulating layer 204 (see FIG. 3C).

For example, the plasma treatment can be performed in such a manner that an inert gas such as an argon (Ar) gas is introduced into a chamber in a vacuum state and a bias voltage is applied to an object (here, the substrate 200), so that a plasma state is produced. When an Ar gas is introduced into the chamber, electrons and cations of Ar are present in plasma, and the cations of Ar are accelerated in a cathode direction (the substrate 200 side). The accelerated cations of Ar collide with the surfaces of the gate insulating layer 204, the source electrode layer 206a, and the drain electrode layer 206b which are formed over the substrate 200 so that the surfaces are sputter-etched and can be etched. Note that such plasma treatment is also referred to as "reverse sputtering".

When the bias voltage is applied to the substrate 200 side and the plasma treatment is performed, the surfaces of the gate insulating layer 204, the source electrode layer 206a, and the drain electrode layer 206b can be sputter-etched effectively.

When unevenness is formed on the surface of the gate insulating layer 204, by the plasma treatment, a projection of the gate insulating layer 204 is preferentially sputter-etched and planarity of the surface of the gate insulating layer 204 can be improved.

As a gas used in the above plasma treatment, a helium gas may be used instead of an argon gas. In addition, an argon atmosphere to which oxygen, hydrogen, nitrogen, or the like is added may be used. Further, an argon atmosphere to which $Cl_2$, $CF_4$, or the like is added may be used.

Figure 4:
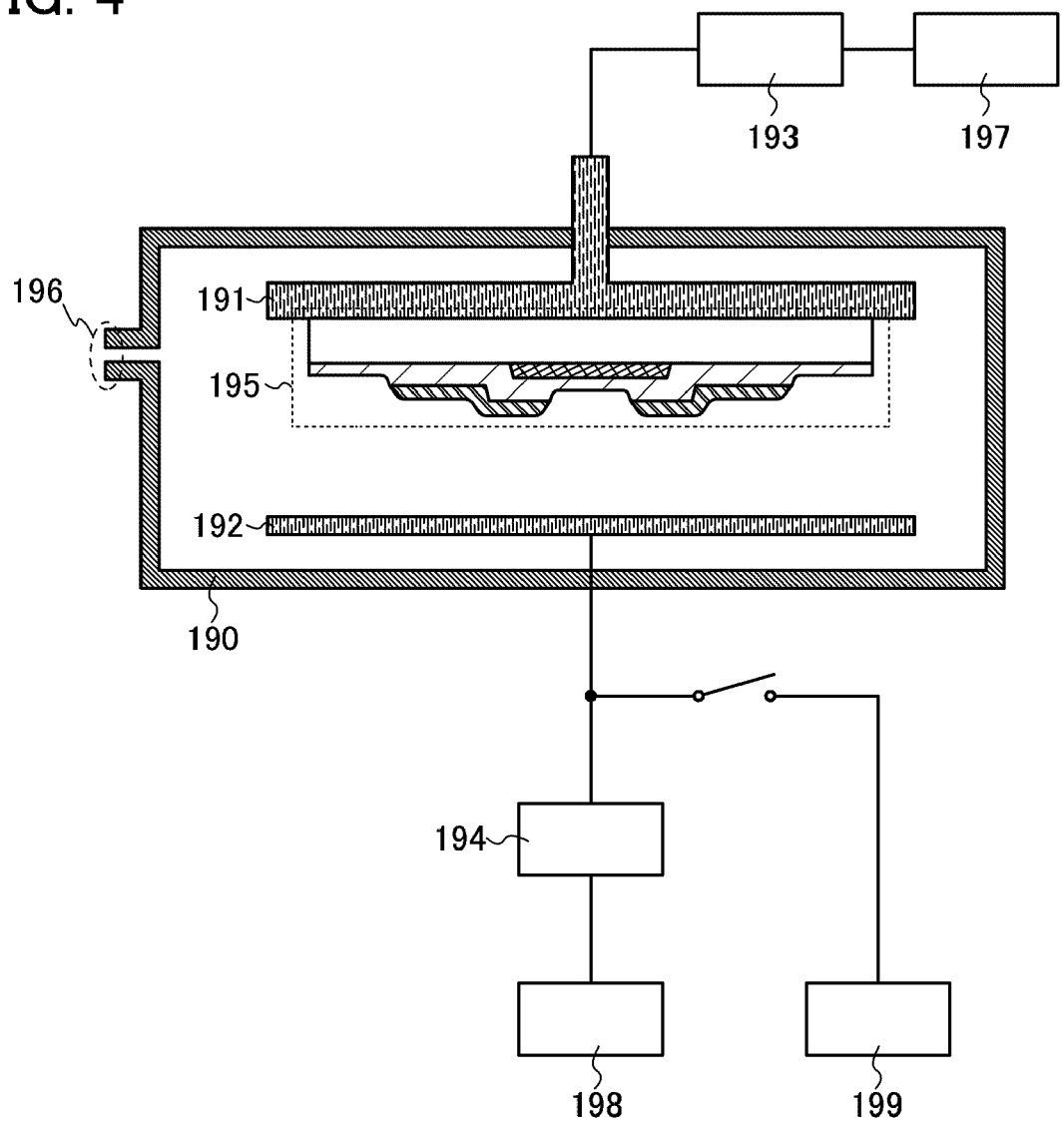
FIG. 4 is a diagram illustrating an example of an apparatus used for plasma treatment according to Embodiment 2.

In this embodiment, the plasma treatment can be performed using a sputtering apparatus as illustrated in FIG. 4, for example.

The sputtering apparatus illustrated in FIG. 4 is provided with, in a chamber 190, a first electrode 191 holding an object 195 (here, the substrate 200) and a second electrode 192 which faces the first electrode 191. In addition, the first electrode 191 is connected to an RF power supply (high frequency power supply) 197, while the second electrode 192 is connected to an RF power supply 198 and a DC power supply 199. A matching box 193 to adjust impedance is provided between the first electrode 191 and the RF power supply 197, while a matching box 194 to adjust impedance is provided between the second electrode 192 and the RF power supply 198.

In the case where the plasma treatment (also referred to as reverse sputtering) is performed on the object 195 using the sputtering apparatus illustrated in FIG. 4, an inert gas such as an argon gas is introduced from an inlet 196, and a high frequency voltage is applied to the first electrode 191; thus, plasma of the inert gas is generated between the first electrode 191 and the second electrode 192. A negative self-bias is generated (that is, a bias voltage is applied) on the side of the object 195 which is provided on the first electrode 191, whereby cations in the plasma are accelerated to collide with the object 195. At this time, when unevenness is formed on the surface of the gate insulating layer 204, a projection is preferentially sputter-etched and the surface of the gate insulating layer 204 can be planarized.

Note that when a film is formed on the object 195 (sputtering film formation) using the sputtering apparatus illustrated in FIG. 4, a target formed from a material which is desired to be formed may be provided on the second electrode 192 side and a DC voltage or a high frequency voltage may be applied to the second electrode 192 to generate plasma between the first electrode 191 and the second electrode 192, whereby cations in the plasma may be accelerated to collide with the target.

Therefore, when a film is formed on the object 195 after the plasma treatment is performed, a film can be formed on the object 195 by a sputtering method in succession to the plasma treatment without exposing the object 195 to air.

Note that in this embodiment, the case is described in which a bias voltage is applied to the substrate 200 side in plasma treatment; however, plasma treatment may be performed without application of the bias voltage as long as the depression portion 207 can be formed in the gate insulating layer 204.

In addition, there is an advantage in that impurities attached to the surface of the gate insulating layer 204 and the surfaces of the source electrode layer 206a and the drain electrode layer 206b can be removed by the plasma treatment.

In FIGS. 3A to 3D, the case is described in which plasma treatment is performed not only on the gate insulating layer 204 but also on the source electrode layer 206a and the drain electrode layer 206b, so that the end portions of the source electrode layer 206a and the drain electrode layer 206b have tapered shapes. For example, it is preferable that a taper angle $\theta_2$ be greater than or equal to 20° and less than 90°, more preferably, greater than or equal to 30° and less than or equal to 80°. Note that when a layer having a tapered shape (here, the source electrode layer 206a or the drain electrode layer 206b) is observed from a cross-sectional direction (a plane which is perpendicular to the surface of the substrate 200), "the taper angle $\theta_2$" refers to an inclination angle of a tip portion inside the layer, which is formed by a side surface of the layer and a bottom surface thereof. That is, the taper angle $\theta_2$ corresponds to an angle of the lower end portion of the source electrode layer 206a or the drain electrode layer 206b which is in contact with the gate insulating layer 204 when observed from the cross-sectional direction. The end portions of the source electrode layer 206a and the drain electrode layer 206b have tapered shapes, whereby coverage of the oxide semiconductor layer to be formed later can be improved and disconnection can be suppressed.

In FIGS. 3A to 3D, the case is described in which the plasma treatment is performed not only on the gate insulating layer 204 but also on the source electrode layer 206a and the drain electrode layer 206b, so that the upper end portions of the source electrode layer 206a and the drain electrode layer 206b have curved surfaces (to have curved surface shapes). For example, radius of curvature R of each upper end portion of the source electrode layer 206a and the drain electrode layer 206b is greater than or equal to 1/100 and less than or equal to 1/2 of the thickness of the source electrode layer 206a or the drain electrode layer 206b after the plasma treatment, preferably, greater than or equal to 3/100 and less than or equal to 1/5 of the thickness of the source electrode layer 206a or the drain electrode layer 206b.

For example, when the thicknesses of the source electrode layer 206a and the drain electrode layer 206b after the plasma treatment are 100 nm, the radius of curvature R of each upper end portion of the source electrode layer 206a and the drain electrode layer 206b is greater than or equal to 1 nm and less than or equal to 50 nm, preferably greater than or equal to 3 nm and less than or equal to 20 nm. Alternatively, the radius of curvature R of each upper end portion of the source electrode layer 206a and the drain electrode layer 206b may be continuously changed within this range. In the case where the upper end portions of the source electrode layer 206a and the drain electrode layer 206b have curved surfaces, coverage of the oxide semiconductor layer to be formed later can be improved and disconnection can be suppressed. In particular, when the thickness of the oxide semiconductor layer is smaller than the length (step) which is the sum of the thickness of the source electrode layer 206a or the drain electrode layer 206b and the depth of a dent, an effect of suppressing disconnection is remarkable.

It is preferable that the end portions of the source electrode layer 206a and the drain electrode layer 206b be formed to have a tapered shape and that the depression portion 207 of the gate insulating layer 204 be formed to have a tapered shape. In this case, coverage of the oxide semiconductor layer formed in a portion where the gate insulating layer 204 is in contact with the source electrode layer 206a or the drain electrode layer 206b can be improved, and disconnection can be prevented effectively. Note that the phrase "the depression portion 207 of the gate insulating layer 204 is formed to have a tapered shape" means that an inclination angle $\theta_3$ on the dent side, which is formed by the bottom surface of the dent of the gate insulating layer 204 and the side surface thereof (or an inclination angle on the dent side, which is formed by a side surface of the dent and the surface of the substrate 200) is greater than or equal to 90°.

As described above, the plasma treatment is performed not only on the gate insulating layer 204 but also on the source electrode layer 206a and the drain electrode layer 206b, whereby the source electrode layer 206a and the drain electrode layer 206b can have tapered shapes and the upper end portions of the source electrode layer 206a and the drain electrode layer 206b can have curved surfaces and the depression portion 207 is formed in the gate insulating layer 204.

Figure 3D:
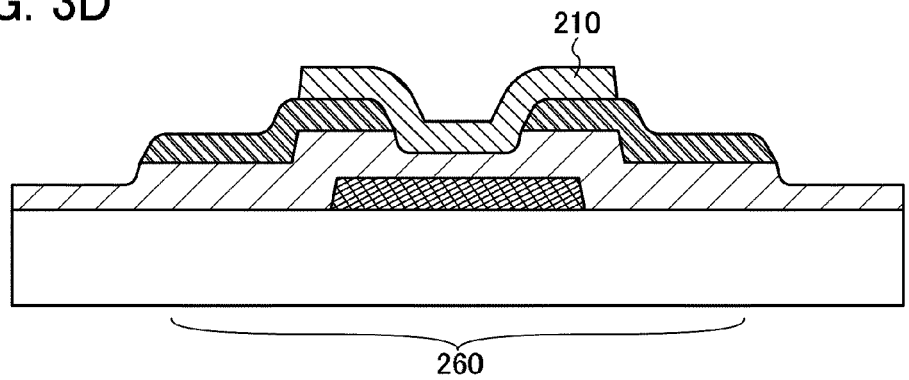

Next, an oxide semiconductor layer is formed to cover the gate insulating layer 204, the source electrode layer 206a, and the drain electrode layer 206b, and then the oxide semiconductor layer is selectively etched, whereby the oxide semiconductor layer 210 is formed (see FIG. 3D). For a material and a manufacturing method of the oxide semiconductor layer 210, refer to Embodiment 1.

According to this embodiment, a semiconductor device including a transistor having a high property can be provided. Note that this embodiment can be implemented in combination with any of the other embodiments, as appropriate.

Embodiment 3

In this embodiment, a structure of a transistor which is different from that described in the above embodiment will be described with reference to FIGS. 5A to 5C.

Figure 5A:
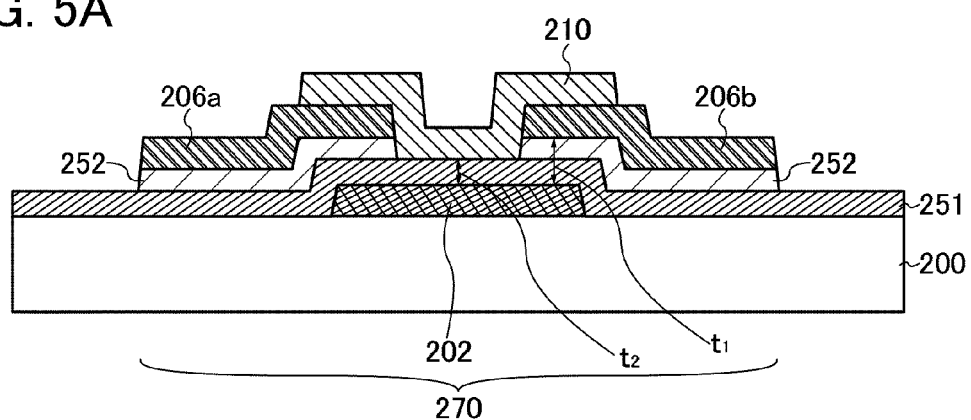
FIGS. 5A to 5C are views each illustrating an example of a semiconductor device according to Embodiment 3.

A thin film transistor 270 illustrated in FIG. 5A includes a first insulating layer 251 provided over the substrate 200, a second insulating layer 252 provided over the first insulating layer 251, the source electrode layer 206a and the drain electrode layer 206b which are provided to overlap with part of the gate electrode layer 202 with the first insulating layer 251 and the second insulating layer 252 interposed therebetween, and the oxide semiconductor layer 210 which is provided over the source electrode layer 206a and the drain electrode layer 206b and is provided in contact with the first insulating layer 251 located in a region between the source electrode layer 206a and the drain electrode layer 206b.

That is, the second insulating layer 252 has a structure in which the second insulating layer 252 is removed in the region where the second insulating layer 252 overlaps with the gate electrode layer 202 and does not overlap with the source electrode layer 206a and the drain electrode layer 206b. In this case, an insulating layer located between the source electrode layer 206a and the drain electrode layer 206b is formed from the first insulating layer 251, and an insulating layer provided between the gate electrode layer 202 and the source electrode layer 206a or an insulating layer provided between the gate electrode layer 202 and the drain electrode layer 206b are formed from a stacked structure of the first insulating layer 251 and the second insulating layer 252.

The thickness $t_2$ of the insulating layer located between the source electrode layer 206a and the drain electrode layer 206b becomes smaller than the thickness $t_1$ of the insulating layer provided between the gate electrode layer 202 and the source electrode layer 206a or the insulating layer provided between the gate electrode layer 202 and the drain electrode layer 206b. In FIG. 5A, the thickness $t_1$ corresponds to the sum of the thicknesses of the first insulating layer 251 and the second insulating layer 252, whereas the thickness $t_2$ corresponds to the thickness of the first insulating layer 251.

In this manner, with the structure illustrated in FIG. 5A, even when the source electrode layer 206a and the drain electrode layer 206b are provided over the gate electrode layer 202 with the first insulating layer 251 and the second insulating layer 252 interposed therebetween and the oxide semiconductor layer 210 is provided over the source electrode layer 206a and the drain electrode layer 206b, a driving voltage of a transistor can be reduced and element characteristics can be improved and parasitic capacitance generated between the source electrode layer 206a and the gate electrode layer 202 or between the drain electrode layer 206b and the gate electrode layer 202 can be reduced.

In the structure illustrated in FIG. 5A, it is preferable that materials used for the first insulating layer 251 and the second insulating layer 252 be different from each other. More preferably, a dielectric constant of the material used for the first insulating layer 251 is higher than a dielectric constant of the material used for the second insulating layer 252. When the dielectric constant of the first insulating layer 251 is higher than the dielectric constant of the second insulating layer 252, a driving voltage of a transistor can be reduced, whereby an effect of parasitic capacitance generated between the source electrode layer 206a and the gate electrode layer 202 or between the drain electrode layer 206b and the gate electrode layer 202 can be reduced effectively.

When the material to be used for the first insulating layer 251 is different from that for the second insulating layer 252, etching selectivity can be easily obtained when the second insulating layer 252 is etched. "To have etching selectivity" means that, in conducting etching of a layer A and a layer B, the etching rate of the layer A and the etching rate of the layer B vary from each other to a sufficient degree. In addition, "etching rate" means the amount of etching (etching quantity) per unit time. Therefore, "etching rate is large" means to be etched more easily, whereas "etching rate is small" means to be less likely to be etched.

The thickness of the first insulating layer 251 and the thickness of the second insulating layer 252 can be set as appropriate in accordance with their materials. For example, as the first insulating layer 251, a silicon nitride film, an aluminum oxide film, a hafnium oxide film, or an insulating layer in which any of these films are combined can be formed to have a thickness of 5 nm to 200 nm, and as the second insulating layer 252, an aluminum oxide film, a polyimide film, or an insulating layer or the like in which any of these films are combined can be formed to have a thickness of 5 nm to 200 nm. When a driving voltage is further reduced and the parasitic capacitance generated between the source electrode layer 206a and the gate electrode layer 202 or between the drain electrode layer 206b and the gate electrode layer 202 is reduced, it is preferable that the thickness of the first insulating layer 251 become smaller than the thickness of the second insulating layer 252.

Figure 5B:
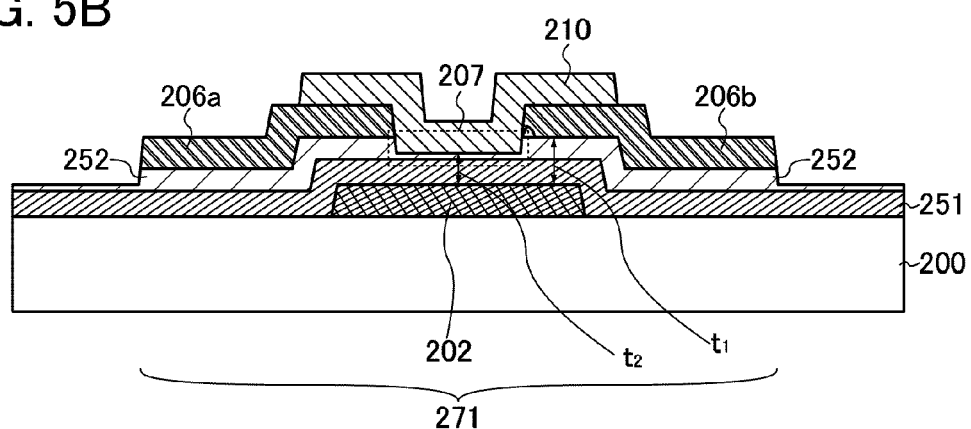
Figure 5C:
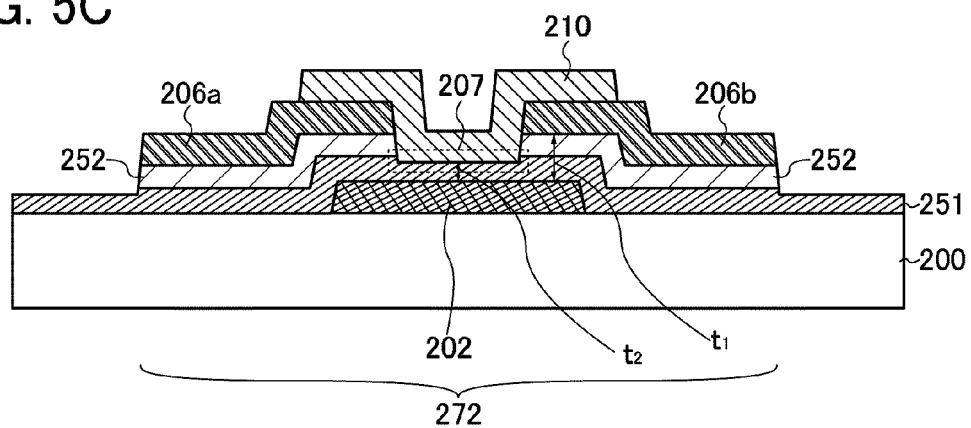

Note that the transistor described in this embodiment is not limited to the structure of FIG. 5A, and may have a structure illustrated in FIG. 5B or FIG. 5C.

A thin film transistor 271 illustrated in FIG. 5B includes the first insulating layer 251 provided over the substrate 200, the second insulating layer 252 provided over the first insulating layer 251, the source electrode layer 206a and the drain electrode layer 206b which are provided to overlap with part of the gate electrode layer 202 with the first insulating layer 251 and the second insulating layer 252 interposed therebetween, and the oxide semiconductor layer 210 which is provided over the source electrode layer 206a and the drain electrode layer 206b and is provided in contact with the second insulating layer 252 located in a region between the source electrode layer 206a and the drain electrode layer 206b. The upper layer portion of the second insulating layer 252 located in the region between the source electrode layer 206a and the drain electrode layer 206b is removed.

That is, the second insulating layer 252 has the depression portion 207 in a region which overlaps with the gate electrode layer 202, and the oxide semiconductor layer 210 is provided in the depression portion 207 of the second insulating layer 252.

As a difference from the structure illustrated in FIG. 5A, a transistor 272 illustrated in FIG. 5C includes the first insulating layer 251 which has the depression portion 207 in a region where the second insulating layer 252 overlaps with the gate electrode layer 202 and in a region located between the source electrode layer 206a and the drain electrode layer 206b, and the oxide semiconductor layer 210 is provided in the depression portion 207 of the first insulating layer 251.

Even when the structure illustrated in FIG. 5B or FIG. 5C is used, the thickness $t_2$ of the insulating layer located between the source electrode layer 206a and the drain electrode layer 206b can become smaller than the thickness $t_1$ of the insulating layer provided between the gate electrode layer 202 and the source electrode layer 206a or the insulating layer provided between the gate electrode layer 202 and the drain electrode layer 206b.

In FIGS. 5A to 5C, the case is illustrated in which a two-layer structure having the first insulating layer 251 and the second insulating layer 252 is provided as an insulating layer between the gate electrode layer 202 and the source electrode layer 206a and the drain electrode layer 206b; however, the insulating layer of this embodiment is not limited to a two-layer structure and may have a three-layer structure.

Next, an example of a method for manufacturing the transistor 270 illustrated in FIG. 5A is described with reference to FIGS. 6A to 6E. Note that many portions in the manufacturing process in FIGS. 6A to 6E are common with those in FIGS. 1A and 1B. Therefore, in the following description, repeated description of the same portions is omitted, and different points are described in detail.

Figure 6A:
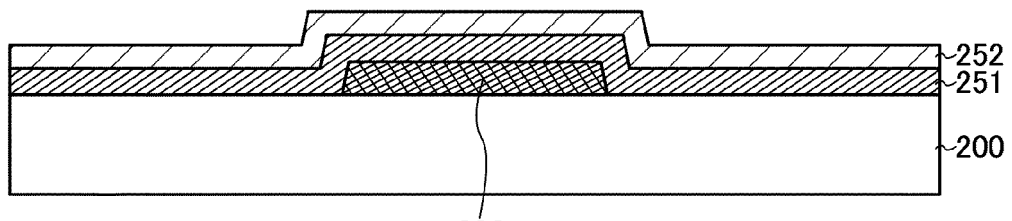
FIGS. 6A to 6E are views illustrating an example of a method for manufacturing a semiconductor device according to Embodiment 3.

First, the gate electrode layer 202 is formed over the substrate 200 having an insulating surface, and then the first insulating layer 251 and the second insulating layer 252 are sequentially stacked over the gate electrode layer 202 (see FIG. 6A).

The first insulating layer 251 and the second insulating layer 252 can be formed using a silicon oxide film, a silicon oxynitride film, a silicon nitride film, a silicon nitride oxide film, an aluminum oxide film, a tantalum oxide film, a hafnium oxide film, or the like.

It is preferable that the first insulating layer 251 and the second insulating layer 252 be formed using different materials. In particular, materials and thicknesses are preferably determined so that the dielectric constant of the first insulating layer 251 is higher than the dielectric constant of the second insulating layer 252. For example, as the first insulating layer 251, a film which is formed by sequentially stacking a silicon oxide film and a silicon nitride film can be formed to have a thickness of 5 nm to 200 nm, and as the second insulating layer 252, a silicon oxide film can be formed to have a thickness of 5 nm to 200 nm.

As described above, as the first insulating layer 251, a silicon nitride film, an aluminum oxide film, a hafnium oxide film, or an insulating layer in which any of these films are combined can be formed to have a thickness of 5 nm to 200 nm; as the second insulating layer 252, an aluminum oxide film, a polyimide film, or an insulating layer or the like in which any of these films are combined can be formed to have a thickness of 5 nm to 200 nm.

For a material and a manufacturing method of the gate electrode layer 202, refer to Embodiment 1.

Figure 6B:
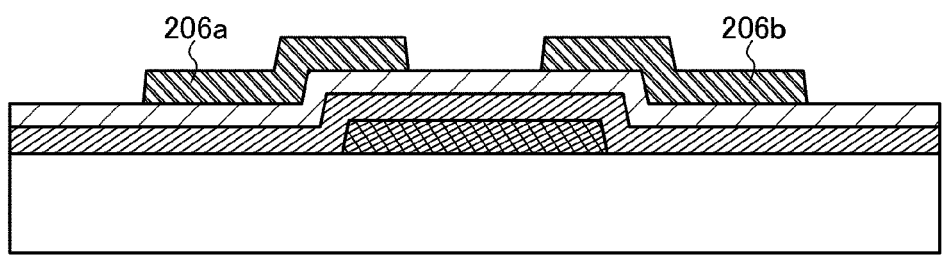

Next, the source electrode layer 206a and the drain electrode layer 206b are formed over the second insulating layer 252 (see FIG. 6B). For a material and a manufacturing method of the source electrode layer 206a and the drain electrode layer 206b, refer to Embodiment 1.

Figure 6C:
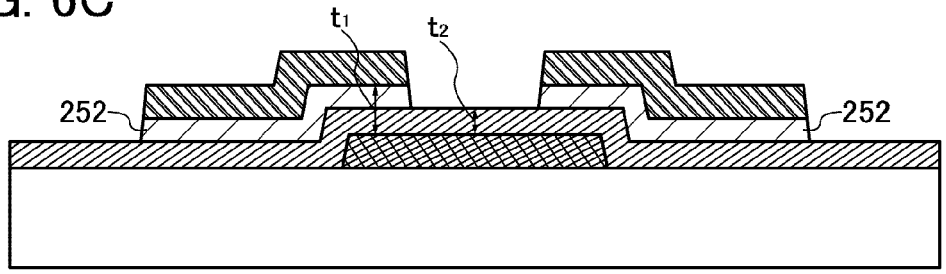
Figure 6D:
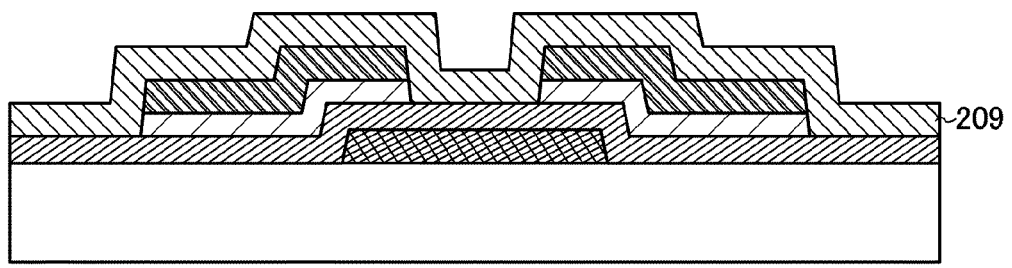

Next, etching treatment is performed on the second insulating layer 252 (the exposed second insulating layer 252) formed between the source electrode layer 206a and the drain electrode layer 206b, whereby the second insulating layer 252 is removed and the first insulating layer 251 is exposed (see FIG. 6C).

By the etching treatment, the thickness $t_2$ of the insulating layer (here, the first insulating layer 251) located in a region between the source electrode layer 206a and the drain electrode layer 206b becomes smaller than the thickness $t_1$ of the insulating layer provided between the gate electrode layer 202 and the source electrode layer 206a or the insulating layer provided between the gate electrode layer 202 and the drain electrode layer 206b (here, a stacked film of the first insulating layer 251 and the second insulating layer 252).

The etching treatment may be dry etching or wet etching. For example, as the etching treatment, dry etching is performed using a mixed gas of $C_4F_8$ and Ar, whereby etching selectivity of the silicon oxide film to the silicon nitride film can be obtained and the second insulating layer 252 can be removed effectively.

Note that conditions of the etching treatment are controlled, whereby part of the second insulating layer 252 formed between the source electrode layer 206a and the drain electrode layer 206b may remain (corresponding to FIG. 5B), or the upper layer portion of the first insulating layer 251 may be etched and the second insulating layer 252 formed between the source electrode layer 206a and the drain electrode layer 206b may be removed to form the depression portion in the first insulating layer 251 (corresponding to FIG. 5C).

In addition, in the etching treatment, the source electrode layer 206a and the drain electrode layer 206b can be used as masks. Alternatively, the photomask used when the source electrode layer 206a and the drain electrode layer 206b are formed (FIG. 6B) can be used in etching the second insulating layer 252.

Figure 6E:
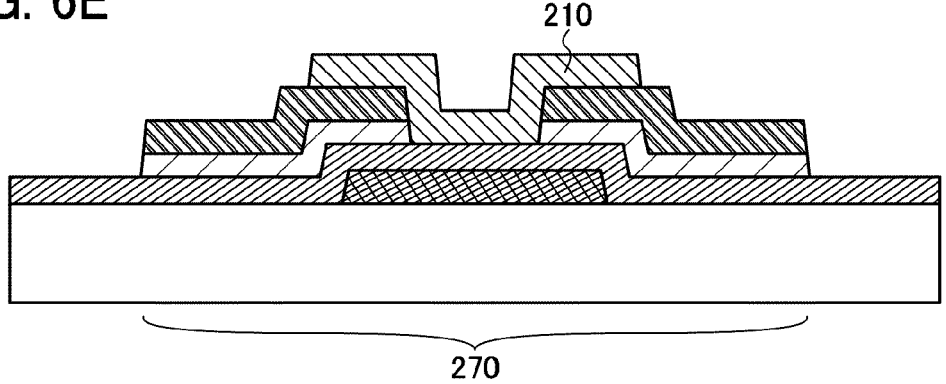

Next, the oxide semiconductor layer 209 is formed to cover the first insulating layer 251, the second insulating layer 252, the source electrode layer 206a, and the drain electrode layer 206b (see FIG. 6D), and then the oxide semiconductor layer 210 is formed by selective etching of the oxide semiconductor layer 209 (see FIG. 6E). For a material and a manufacturing method of the oxide semiconductor layer 209 (the oxide semiconductor layer 210), refer to Embodiment 1.

According to this embodiment, a semiconductor device including a transistor having a high property can be provided. Note that this embodiment can be implemented in combination with any of the other embodiments, as appropriate.

Embodiment 4

In this embodiment, a structure of a transistor which is different from that described in the above embodiment will be described with reference to FIGS. 7A and 7B.

Figure 7A:
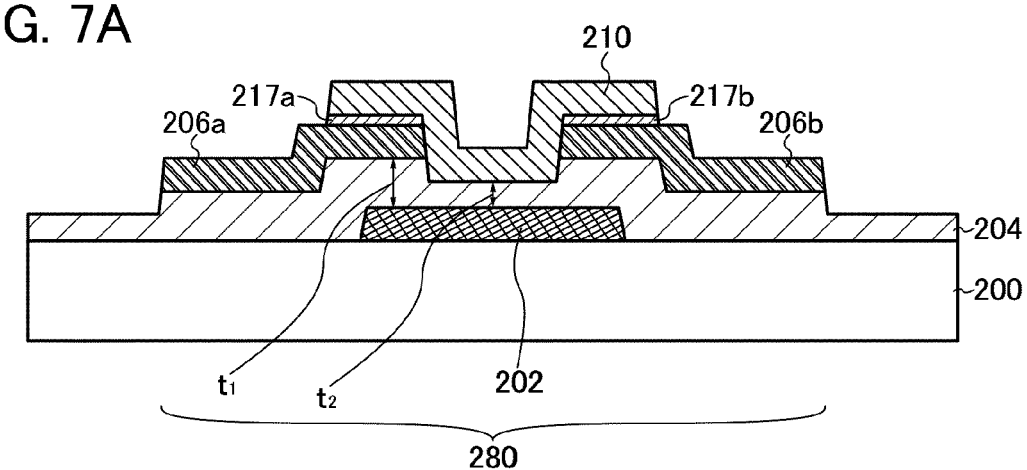
FIGS. 7A and 7B are views each illustrating an example of a semiconductor device according to Embodiment 4.
Figure 7B:
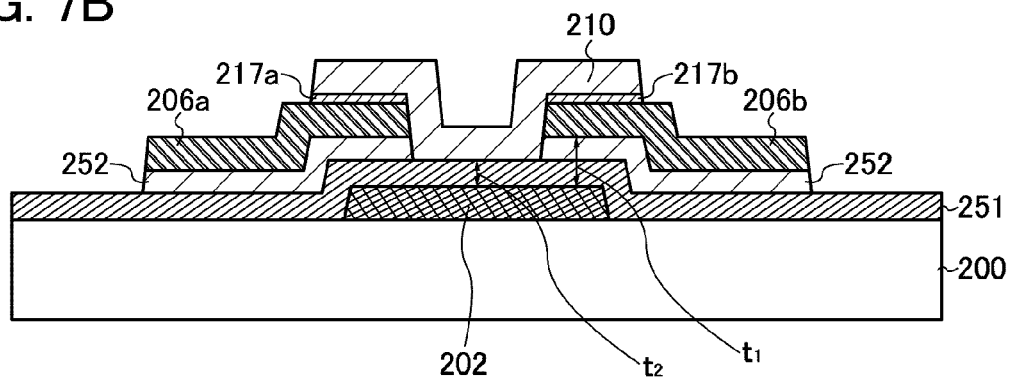

A thin film transistor 280 illustrated in FIG. 7A includes the gate insulating layer 204 provided over the substrate 200, the source electrode layer 206a and the drain electrode layer 206b which are provided to overlap with part of the gate electrode layer 202 with the gate insulating layer 204 interposed therebetween, and the oxide semiconductor layer 210 which is provided over the source electrode layer 206a and the drain electrode layer 206b with a buffer layer 217a and a buffer layer 217b interposed therebetween and is provided in contact with the gate insulating layer 204 located between the source electrode layer 206a and the drain electrode layer 206b. Further, the thickness $t_2$ of the gate insulating layer 204 which is located in the region between the source electrode layer 206a and the drain electrode layer 206b becomes smaller than the thickness $t_1$ of the gate insulating layer 204 provided between the gate electrode layer 202 and the source electrode layer 206a or the gate insulating layer 204 provided between the gate electrode layer 202 and the drain electrode layer 206b (see FIG. 7A).

That is, the transistor illustrated in FIG. 7A has a structure in which the buffer layers 217a and 217b are added to the transistor illustrated in FIG. 1A.

The buffer layers 217a and 217b suppress oxidation of the surfaces of the source electrode layer 206a and the drain electrode layer 206b in a manufacturing process, and function as layers to favorably perform electrical connection between the oxide semiconductor layer 210 functioning as a channel formation region and the source electrode layer 206a and the drain electrode layer 206b.

The buffer layers 217a and 217b can be formed using an oxide semiconductor layer whose conductivity is the same as or higher than conductivity of the oxide semiconductor layer 210. For example, the buffer layers 217a and 217b can be formed using an In—Ga—Zn—O-based non-single-crystal film, and the oxide semiconductor layer 210 can be formed using an In—Ga—Zn—O-based non-single-crystal film whose conductivity is lower than that of the buffer layers 217a and 217b.

In this manner, the buffer layers 217a and 217b are provided between the source electrode layer 206a and the drain electrode layer 206b and the oxide semiconductor layer 210, whereby contact resistance can be reduced and element characteristics of a transistor can be improved.

Next, an example of a method for manufacturing the thin film transistor 280 illustrated in FIG. 7A is described with reference to FIGS. 8A to 8E. Note that many portions in the manufacturing process in FIGS. 8A to 8E are common with those in FIGS. 1A and 1B. Therefore, in the following description, repeated description of the same portions is omitted, and different points are described in detail.

Figure 8A:
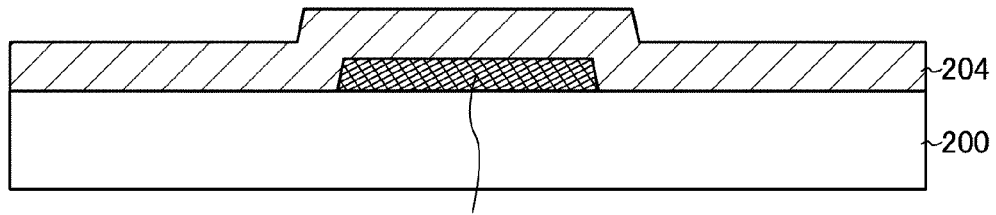
FIGS. 8A to 8E are views illustrating an example of a method for manufacturing a semiconductor device according to Embodiment 4.

First, the gate electrode layer 202 is formed over the substrate 200 having an insulating surface, and then the gate insulating layer 204 is formed over the gate electrode layer 202 (see FIG. 8A). For materials and manufacturing methods of the gate electrode layer 202 and the gate insulating layer 204, refer to Embodiment 1.

Figure 8B:
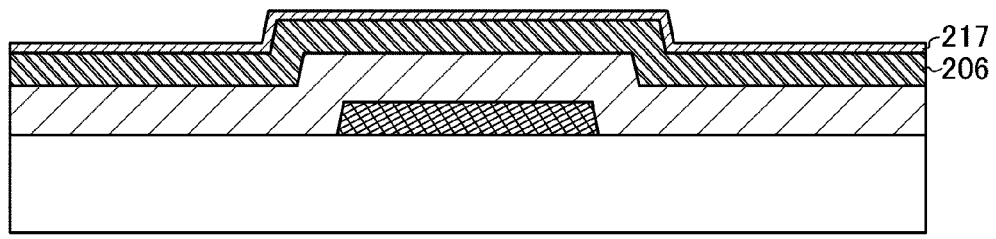

Next, a conductive layer 206 is formed over the gate insulating layer 204, and then an oxide semiconductor layer 217 is formed over the conductive layer 206 (see FIG. 8B).

The conductive layer 206 can be formed by a sputtering method, a vacuum evaporation method, or the like using metal including an element selected from aluminum (Al), copper (Cu), titanium (Ti), tantalum (Ta), tungsten (W), molybdenum (Mo), chromium (Cr), neodymium (Nd), and scandium (Sc); an alloy including the above element as a component; or a material including nitride or the like in which the above element is a component.

For example, the conductive layer 206 can be formed to have a single-layer structure of a molybdenum film or a titanium film. The conductive layer 206 may be formed to have a stacked structure, for example, a stacked structure of an aluminum film and a titanium film. A three-layer structure in which a titanium film, an aluminum film, and a titanium film are sequentially stacked may be used. A three-layer structure in which a molybdenum film, an aluminum film, and a molybdenum film are sequentially stacked may be used. As the aluminum films used for these stacked structures, an aluminum film including neodymium (Al—Nd) may be used. The conductive layer 206 may have a single-layer structure of an aluminum film including silicon.

The oxide semiconductor layer 217 can be formed using an In—Ga—Zn—O-based non-single-crystal film. For example, the oxide semiconductor layer 217 can be formed over the conductive layer 206 by a sputtering method using an oxide semiconductor target including In, Ga, and Zn ($In_2O_3$:$Ga_2O_3$:ZnO=1:1:1). The condition of sputtering can be set as follows: the distance between the substrate 200 and the target is 30 mm to 500 mm, the pressure is 0.1 Pa to 2.0 Pa, the direct current (DC) power supply is 0.25 kW to 5.0 kW, the temperature is 20° C. to 100° C., an atmosphere is an argon atmosphere, an oxygen atmosphere, or a mixture atmosphere of argon and oxygen, for example.

The oxide semiconductor layer 217 suppresses oxidation of surfaces of a source electrode layer and a drain electrode layer which are to be formed later, and the oxide semiconductor layer 217 also functions as a buffer layer which is used to favorably perform electrical connection between an oxide semiconductor layer serving as a channel formation region to be formed later and the source electrode layer and the drain electrode layer.

In the step of FIG. 8B, it is preferable that the conductive layer 206 be formed and then the oxide semiconductor layer 217 be formed in succession without exposure of the conductive layer 206 to air. The oxide semiconductor layer 217 is formed without exposure of the conductive layer 206 to air, whereby attachment of impurities to or formation of an oxide film on the surface of the conductive layer 206 can be suppressed and contact resistance between the conductive layer 206 and the oxide semiconductor layer 217 can be reduced.

It is preferable that a gas that is less likely to oxidize the surface of the conductive layer 206 be used as a gas used in formation of the oxide semiconductor layer 217. For example, the ratio of a flow rate of an argon gas to a flow rate of an oxygen gas is increased in the formation condition of the oxide semiconductor layer 217 (preferably, an oxygen gas is not introduced). Specifically, the oxide semiconductor layer 217 can be formed under a noble gas atmosphere such as argon or helium or under an atmosphere including an oxygen gas at less than or equal to 10% and a noble gas at greater than or equal to 90%. The ratio of the flow rate of the oxygen gas to the flow rate of the argon gas is reduced, whereby formation of an oxide film on the surface of the conductive layer 206 can be suppressed. As a result, contact resistance between the conductive layer 206 and the oxide semiconductor layer 217 can be reduced.

In addition, the ratio of the flow rate of the oxygen gas to the flow rate of the argon gas is reduced, whereby conductivity of the oxide semiconductor layer which is obtained can be increased. In this case, the oxide semiconductor layer serving as the channel formation region to be formed later can be favorably electrically connected to the source electrode layer and the drain electrode layer.

Next, the conductive layer 206 and the oxide semiconductor layer 217 are etched by a photolithography method, whereby the source electrode layer 206a, the drain electrode layer 206b, the buffer layer 217a, and the buffer layer 217b are formed.

Figure 8C:
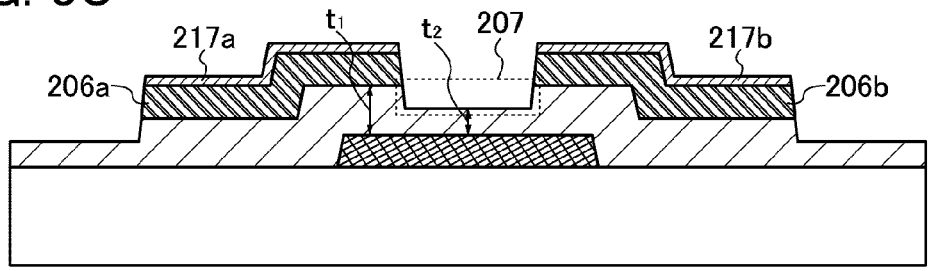
Figure 8D:
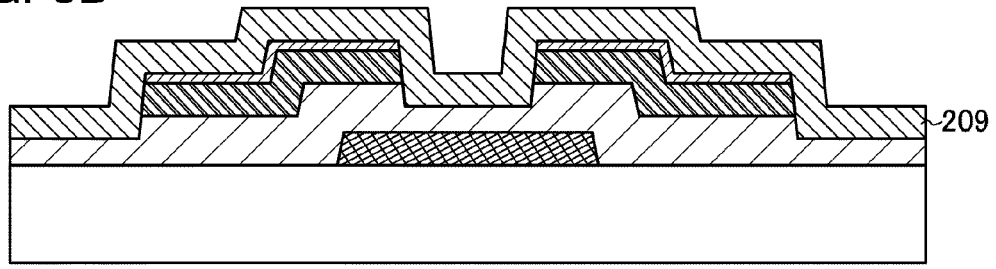

Next, the gate insulating layer 204 (the exposed gate insulating layer 204) provided between the source electrode layer 206a and the drain electrode layer 206b is subjected to etching treatment, whereby the depression portion 207 is formed in the gate insulating layer 204 (see FIG. 8C).

Figure 8E:
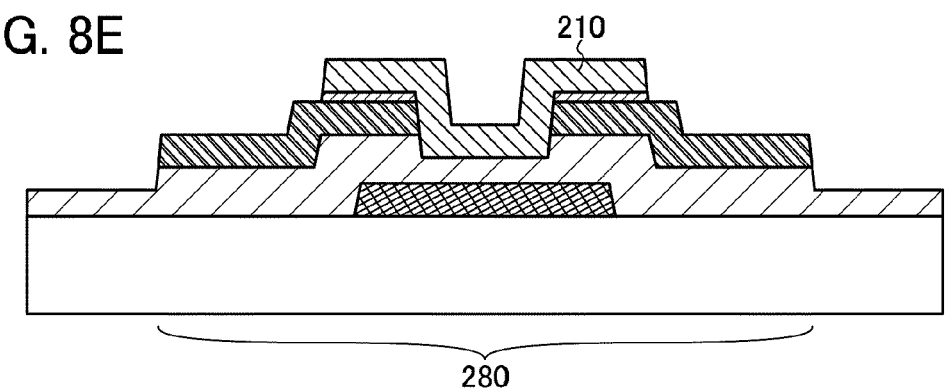

Next, the oxide semiconductor layer 209 is formed to cover the gate insulating layer 204, the source electrode layer 206a, the drain electrode layer 206b, the buffer layer 217a, and the buffer layer 217b (see FIG. 8D), and then the oxide semiconductor layer 209 is selectively etched, whereby the oxide semiconductor layer 210 is formed (see FIG. 8E). At this time, parts of the buffer layer 217a and the buffer layer 217b are etched. For a material and a manufacturing method of the oxide semiconductor layer 209 (the oxide semiconductor layer 210), refer to Embodiment 1.

Note that in FIG. 7A, the structure in which the transistor illustrated in FIG. 1A is provided with the buffer layers 217a and 217b is illustrated, but the structure is not limited thereto. For example, as illustrated in FIG. 7B, the transistor illustrated in FIG. 5A may be provided with the buffer layers 217a and 217b. Alternatively, the structure illustrated in FIG. 1B, FIG. 5B, or FIG. 5C can be provided with the buffer layers 217a and 217b.

According to this embodiment, a semiconductor device including a transistor having a high property can be provided. This embodiment can be implemented in combination with any of the other embodiments, as appropriate.

Embodiment 5

In this embodiment, a manufacturing process of a display device which is an example of a usage pattern of a semiconductor device including a transistor will be described with reference to drawings. Note that many portions in the manufacturing process described in this embodiment are common with those in Embodiment 1. Therefore, in the following description, repeated description of the same portions is omitted, and different points are described in detail. Note that in the following description, FIGS. 9A to 9D and FIGS. 10A to 10D are cross-sectional views, and FIG. 11, FIG. 12, FIG. 13, and FIG. 14 are top views.

Figure 11:
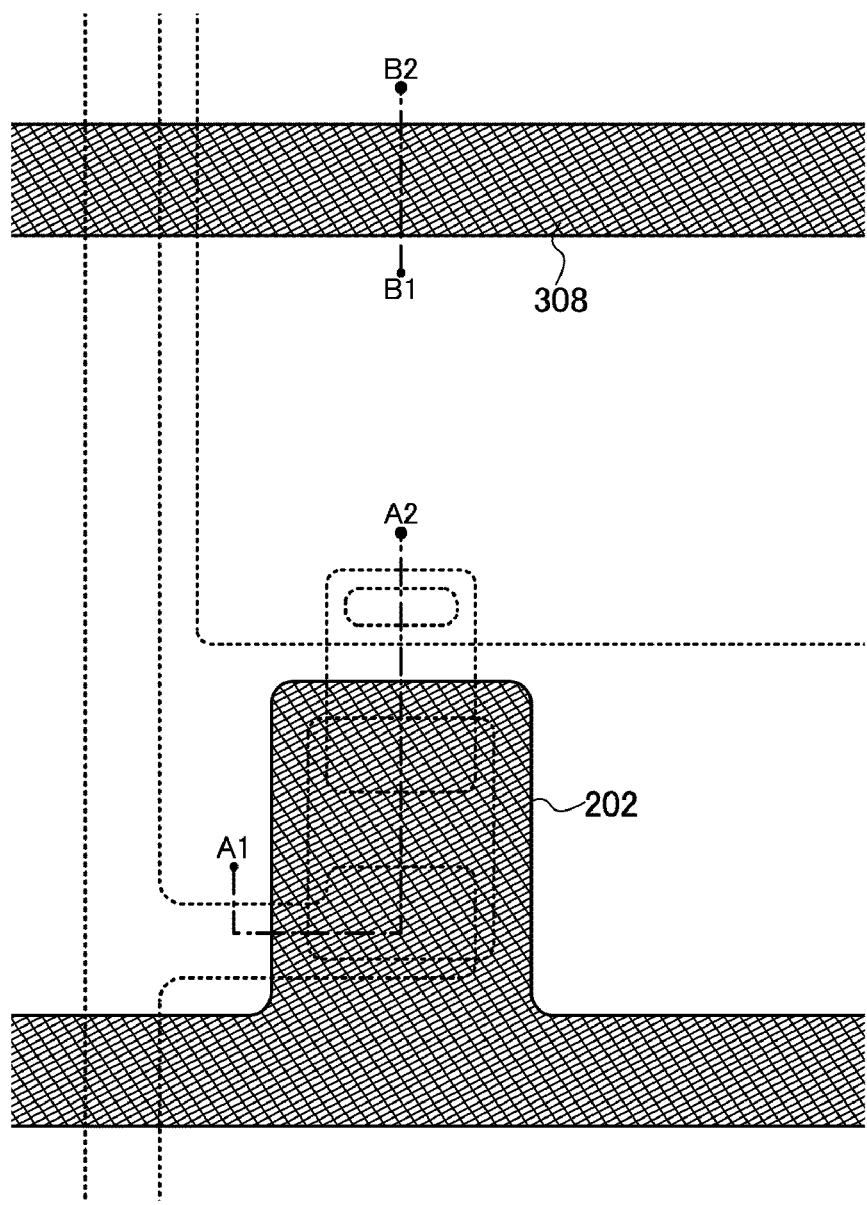
FIG. 11 is a view illustrating an example of a method for manufacturing a semiconductor device according to Embodiment 5.

First, a wiring and an electrode (a gate wiring including the gate electrode layer 202, a capacitor wiring 308, and a first terminal 321) are formed over the substrate 200 having an insulating surface (see FIG. 9A and FIG. 11).

The capacitor wiring 308 and the first terminal 321 can be formed using the same material as that of the gate electrode layer 202. For a material and a manufacturing method of the gate electrode layer 202, refer to Embodiment 1.

Next, the gate insulating layer 204 is formed over the gate electrode layer 202, and then the conductive layer 206 is formed over the gate insulating layer 204 (see FIG. 9B).

The conductive layer 206 can be formed by a sputtering method, a vacuum evaporation method, or the like using metal including an element selected from aluminum (Al), copper (Cu), titanium (Ti), tantalum (Ta), tungsten (W), molybdenum (Mo), chromium (Cr), neodymium (Nd), and scandium (Sc); an alloy including the above element as a component; or a material including nitride or the like in which the above element is a component.

For example, the conductive layer 206 can be formed to have a single-layer structure of a titanium film. The conductive layer 206 may be formed to have a stacked structure, for example, a stacked structure of an aluminum film and a titanium film. A three-layer structure in which a titanium film, an aluminum film including neodymium (Al—Nd), and a titanium film are sequentially stacked may be used. The conductive layer 206 may have a single-layer structure of an aluminum film including silicon.

In FIG. 9B, after the gate insulating layer 204 is formed, a contact hole 213 is formed in the gate insulating layer 204. Then, the conductive layer 206 is formed, and thus the first terminal 321 and the conductive layer 206 are electrically connected to each other.

Figure 12:
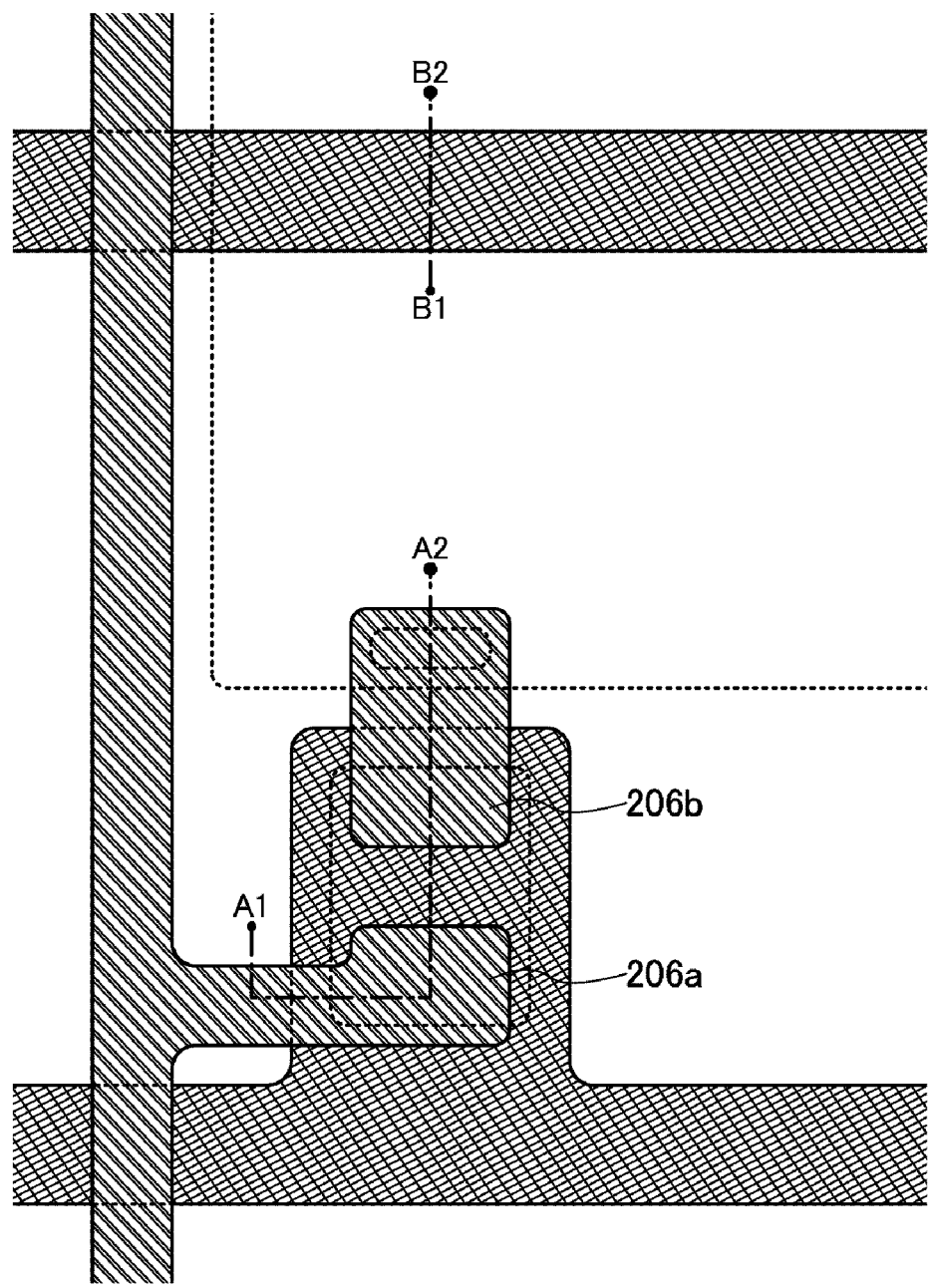
FIG. 12 is a view illustrating an example of a method for manufacturing a semiconductor device according to Embodiment 5.

Next, the conductive layer 206 is etched, whereby the source electrode layer 206a, the drain electrode layer 206b, a connection electrode 320, and a second terminal 322 are formed (see FIG. 9C and FIG. 12).

The second terminal 322 can be electrically connected to a source wiring (a source wiring including the source electrode layer 206a). The connection electrode 320 can be directly connected to the first terminal 321 through the contact hole 213 formed in the gate insulating layer 204.

Next, the gate insulating layer 204 (the exposed gate insulating layer 204) provided between the source electrode layer 206a and the drain electrode layer 206b is subjected to etching treatment, whereby the depression portion 207 is formed in the gate insulating layer 204 (see FIG. 9D).

By the etching treatment, the thickness $t_2$ of the gate insulating layer 204 located in a region between the source electrode layer 206a and the drain electrode layer 206b becomes smaller than the thickness $t_1$ of the gate insulating layer 204 provided between the gate electrode layer 202 and the source electrode layer 206a or the gate insulating layer 204 provided between the gate electrode layer 202 and the drain electrode layer 206b.

As the etching treatment, plasma treatment using an inert gas and/or a reactive gas, a wet etching process, or the like can be used.

Here, plasma treatment is performed on the surfaces of the gate insulating layer 204, the source electrode layer 206a, the drain electrode layer 206b, the connection electrode 320, and the second terminal 322 as the etching treatment. In this case, the end portions of the source electrode layer 206a, the drain electrode layer 206b, the connection electrode 320, and the second terminal 322 can have tapered shapes and the upper end portions of these can be formed to have curve surfaces. For a method of the plasma treatment, refer to Embodiment 2.

In addition, the thickness of the gate insulating layer 204 formed over the capacitor wiring 308 is reduced, whereby the capacitance of a capacitor to be formed later can be increased.

Next, the oxide semiconductor layer 209 is formed to cover the gate insulating layer 204, the source electrode layer 206a, the drain electrode layer 206b, the connection electrode 320, and the second terminal 322 (see FIG. 10A).

It is preferable that the plasma treatment and formation of the oxide semiconductor layer 209 be performed in the same chamber in succession. The plasma treatment and the formation of the oxide semiconductor layer 209 are performed in succession, whereby attachment of impurities to the surfaces of the gate insulating layer 204, the source electrode layer 206a, and the drain electrode layer 206b and formation of an oxide film or the like on the surfaces of the source electrode layer 206a and the drain electrode layer 206b can be suppressed. For a material and a manufacturing method of the oxide semiconductor layer 209, refer to Embodiment 1.

Figure 13:
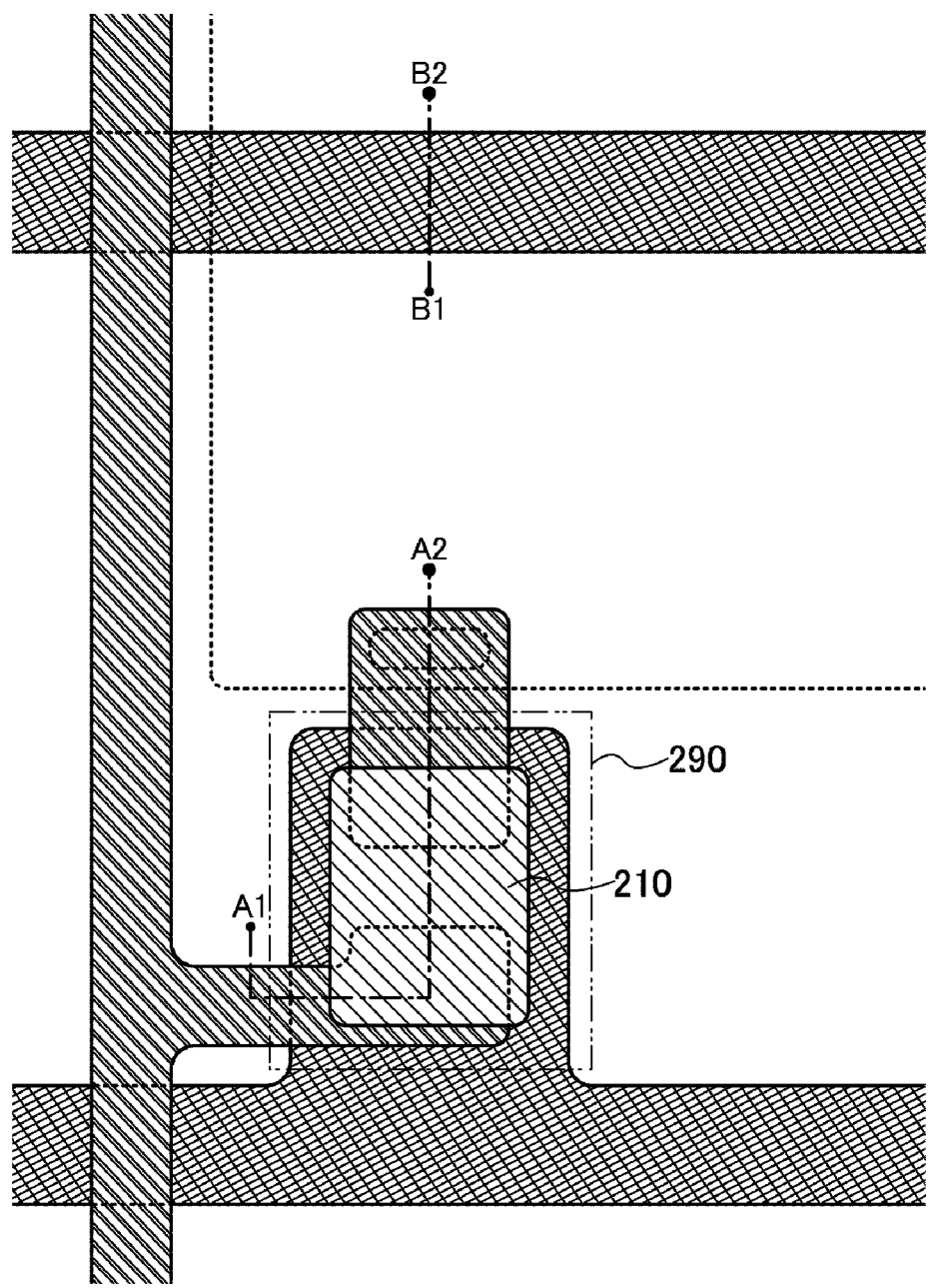
FIG. 13 is a view illustrating an example of a method for manufacturing a semiconductor device according to Embodiment 5.

Next, the oxide semiconductor layer 209 is selectively etched to form the island-shaped oxide semiconductor layer 210, and a thin film transistor 290 is formed (see FIG. 10B and FIG. 13).

Next, heat treatment is preferably performed at 100° C. to 600° C., typically, 200° C. to 400° C. For example, heat treatment is performed under a nitrogen atmosphere at 250° C. for one hour. By this heat treatment, rearrangement of the In—Ga—Zn—O-based non-single-crystal film forming the island-shaped oxide semiconductor layer 210 is performed at the atomic level. This heat treatment (including light annealing) is effective because distortion which hinders the transfer of carriers is reduced by this heat treatment. Note that the timing to perform the heat treatment is not particularly limited as long as it is after the formation of the oxide semiconductor layer 209, and for example, heat treatment may be performed after a pixel electrode is formed.

Further, oxygen radical treatment may be performed on the exposed island-shaped oxide semiconductor layer 210. When the oxygen radical treatment is performed, a thin film transistor in which the island-shaped oxide semiconductor layer 210 serves as a channel formation region can be a normally-off type. In addition, when radical treatment is performed, damage of the island-shaped oxide semiconductor layer 210 due to etching can be repaired. The radical treatment is preferably performed under an atmosphere of $O_2$ or $N_2O$, more preferably $N_2$ including oxygen, He including oxygen, or Ar including oxygen. Further, the radical treatment may be performed under the above atmosphere to which $Cl_2$ and/or $CF_4$ are/is added.

Next, a protective insulating layer 340 covering the thin film transistor 290 is formed, and the protective insulating layer 340 is selectively etched, whereby a contact hole 325 which reaches the drain electrode layer 206b, a contact hole 326 which reaches the connection electrode 320, and a contact hole 327 which reaches the second terminal 322 are formed (see FIG. 10C).

Figure 14:
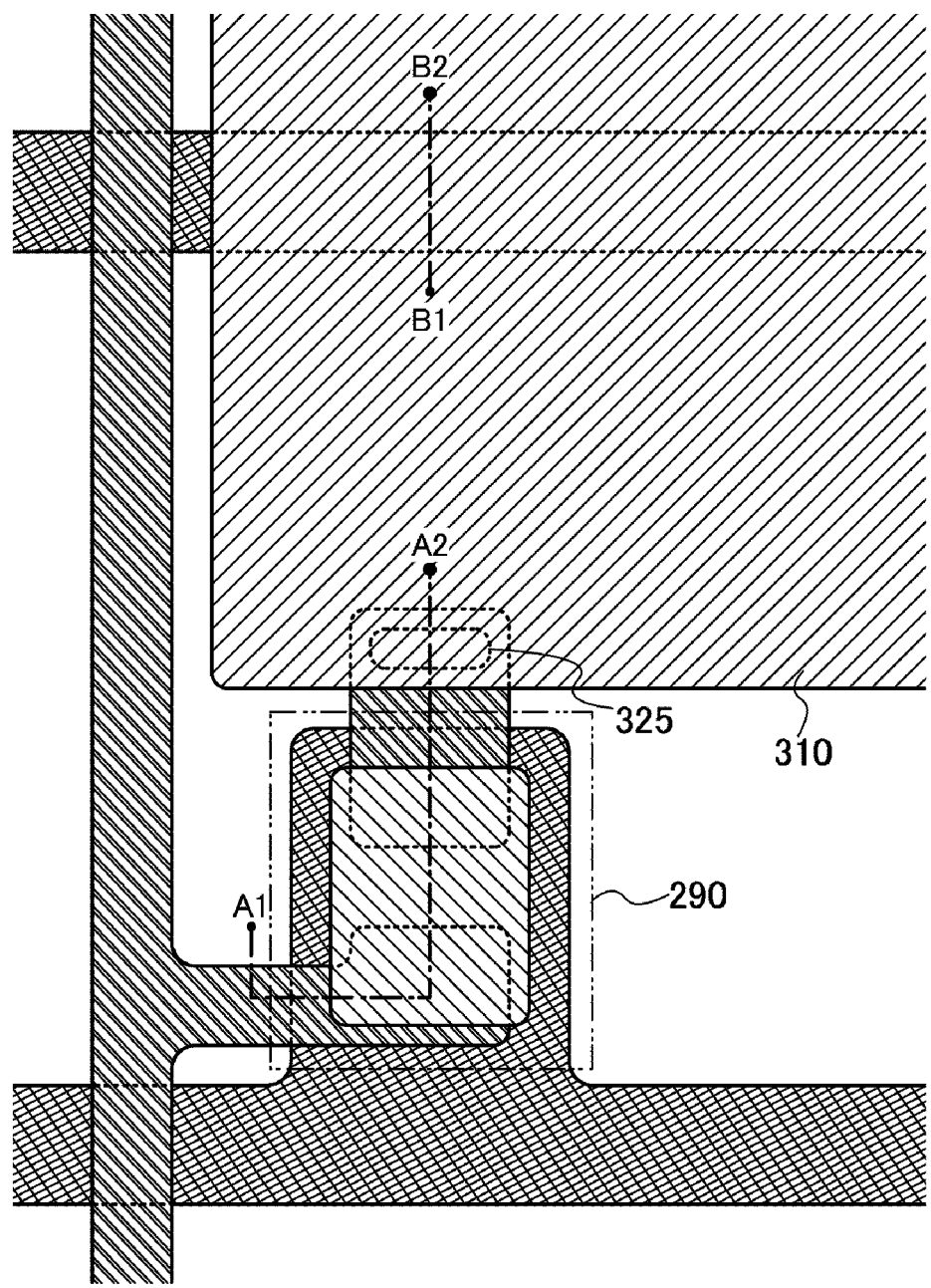
FIG. 14 is a view illustrating an example of a method for manufacturing a semiconductor device according to Embodiment 5.

Next, a transparent conductive layer 310 which is electrically connected to the drain electrode layer 206b, a transparent conductive layer 328 which is electrically connected to the connection electrode 320, and a transparent conductive layer 329 which is electrically connected to the second terminal 322 are formed (see FIG. 10D and FIG. 14).

The transparent conductive layer 310 functions as a pixel electrode, and the transparent conductive layers 328 and 329 serve as electrodes or wirings used for connection with an FPC. More specifically, the transparent conductive layer 328 formed over the connection electrode 320 can be used as a terminal electrode for connection which functions as an input terminal of a gate wiring, and the transparent conductive layer 329 formed over the second terminal 322 can be used as a terminal electrode for connection which functions as an input terminal of a source wiring.

In addition, a storage capacitor can be formed using the capacitor wiring 308, the gate insulating layer 204, the protective insulating layer 340, and the transparent conductive layer 310. In this case, the capacitor wiring 308 and the transparent conductive layer 310 each serve as an electrode, and the gate insulating layer 204 and the protective insulating layer 340 serve as a dielectric.

The transparent conductive layers 310, 328, and 329 can be formed using indium oxide ($In_2O_3$), an alloy of indium oxide and tin oxide ($In_2O_3$—$SnO_2$, abbreviated to ITO), an alloy of indium oxide and zinc oxide ($In_2O_3$—$ZnO$), or the like by a sputtering method, a vacuum evaporation method, or the like. For example, a transparent conductive layer is formed, and then a resist mask is formed over the transparent conductive layer. Then, an unnecessary portion is removed by etching, whereby the transparent conductive layers 310, 328, and 329 can be formed.

Through the above-described steps, elements such as a bottom-gate n-channel thin film transistor and the storage capacitor can be completed. Then, these elements are arranged in matrix corresponding to pixels so that the substrate provided with these elements can be used as one substrate for forming an active matrix display device. In this specification, such a substrate is referred to as an active matrix substrate for convenience.

When an active matrix liquid crystal display device is manufactured, a liquid crystal layer may be provided between an active matrix substrate and a counter substrate provided with a counter electrode, and the active matrix substrate and the counter substrate may be fixed.

Figure 15:
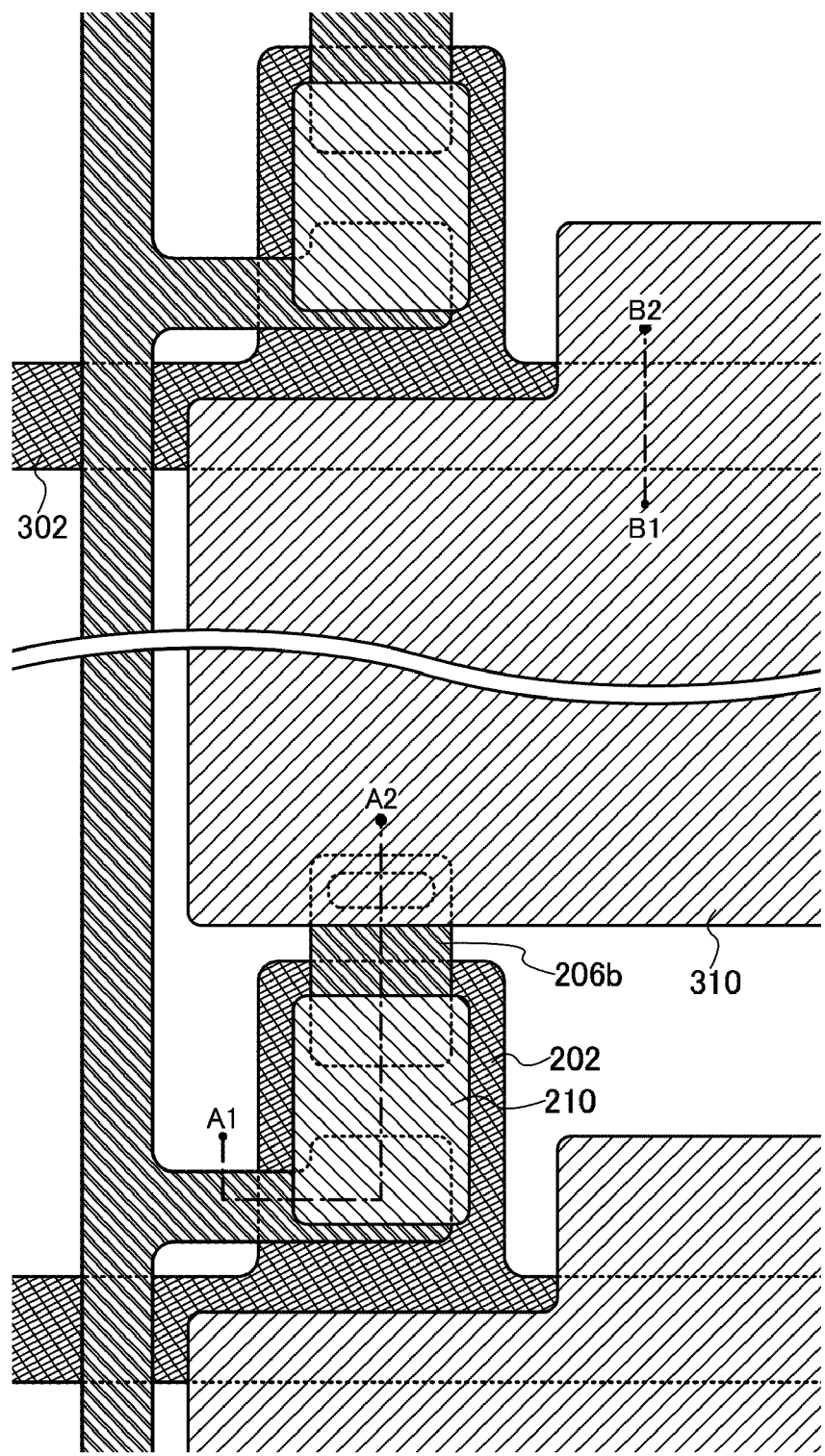
FIG. 15 is a view illustrating an example of a method for manufacturing a semiconductor device according to Embodiment 5.

The structure described in this embodiment is not limited to the pixel structure illustrated in FIG. 14. An example of another structure is illustrated in FIG. 15. In FIG. 15, the capacitor wiring 308 is not provided, and a storage capacitor is formed using the transparent conductive layer 310 which functions as a pixel electrode and a gate wiring 302 of an adjacent pixel as electrodes and the protective insulating layer 340 and the gate insulating layer 204 as a dielectric.

Note that this embodiment can be implemented in combination with any of the other embodiments, as appropriate.

Embodiment 6

In this embodiment, the case where a semiconductor device (also referred to as a display device) having a display function in which thin film transistors are used for a pixel portion and a driver circuit is manufactured will be described. In addition, part of a driver circuit manufactured using a thin film transistor or the entire driver circuit manufactured using a thin film transistor can be formed over the same substrate as a pixel portion, so that a system-on-panel can be manufactured.

The display device includes a display element. As the display element, a liquid crystal element (also referred to as a liquid crystal display element) or a light-emitting element (also referred to as a light-emitting display element) can be used. The light-emitting element refers to an element, luminance of which is controlled by a current or a voltage. Specifically, the light-emitting element refers to an inorganic EL (electroluminescence) element, an organic EL element, and the like. Further, a display medium whose contrast is changed by an electric effect, such as an electronic ink, can be used.

In addition, the display device includes a panel in which a display element is sealed, and a module in which an IC and the like including a controller are mounted on the panel. The display device relates to one mode of an element substrate before the display element is completed in a manufacturing process of the display device, and the element substrate is provided with a means for supplying a current to the display element in each of a plurality of pixels. Specifically, the element substrate may be in a state provided with only a pixel electrode of the display element, a state after a conductive layer to be a pixel electrode is formed and before the conductive layer is etched to form the pixel electrode, or other states.

A display device in this specification means an image display device, a display device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

In this embodiment, an example of a liquid crystal display device is described as a semiconductor device which is one mode of the present invention. First, the appearance and a cross section of a liquid crystal display panel, which is one mode of the semiconductor device, is described with reference to FIGS. 16A1, 16A2, and 16B. FIGS. 16A1 and 16A2 are each a top view of a panel in which highly reliable thin film transistors 4010 and 4011 which include a semiconductor layer of an In—Ga—Zn—O-based non-single-crystal film, and a liquid crystal element 4013, which are formed over a first substrate 4001, are sealed between the first substrate 4001 and a second substrate 4006 with a sealing material 4505. FIG. 16B corresponds to a cross-sectional view of FIGS. 16A1 and 16A2 along line M-N.

A sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed with the sealing material 4005 between the first substrate 4001 and the second substrate 4006. A signal line driver circuit 4003 that is formed using a single crystal semiconductor film or a polycrystalline semiconductor film over a substrate which is prepared separately is mounted in a region that is different from the region surrounded by the sealing material 4005 over the first substrate 4001.

Note that a connection method of a driver circuit which is separately formed is not particularly limited, and a COG method, a wire bonding method, a TAB method, or the like can be used. FIG. 16A1 illustrates an example in which the signal line driver circuit 4003 is mounted by a COG method, and FIG. 16A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 16B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

As the thin film transistors 4010 and 4011, highly reliable thin film transistors including an In—Ga—Zn—O-based non-single-crystal film as a semiconductor layer can be used. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap corresponds to the liquid crystal element 4013. Note that the pixel electrode layer 4030 and the counter electrode layer 4031 are provided with insulating layers 4032 and 4033 which function as alignment films, respectively, and the liquid crystal layer 4008 is sandwiched between the pixel electrode layer 4030 and the counter electrode layer 4031 with the insulating layers 4032 and 4033 interposed between the liquid crystal layer 4008, and the pixel electrode layer 4030 and the counter electrode layer 4031.

Note that the first substrate 4001 and the second substrate 4006 can be formed using glass, metal (typically, stainless steel), ceramic, or plastic. As for plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer 4035 which can be obtained in such a manner that an insulating layer is selectively etched is provided to control a distance (a cell gap) between the pixel electrode layer 4030 and the counter electrode layer 4031. Note that a spherical spacer may also be used. In addition, the counter electrode layer 4031 is electrically connected to a common potential line provided on the same substrate as the thin film transistor 4010. By use of a common connection portion, the counter electrode layer 4031 and the common potential line can be electrically connected to each other through conductive particles arranged between a pair of substrates. Note that the conductive particles are included in the sealing material 4005.

In addition, liquid crystal exhibiting a blue phase without the use of an alignment film may be used. The blue phase is one of liquid crystal phases and a phase which appears just before the transition from a cholesteric phase to an isotropic phase when the temperature of cholesteric liquid crystal is increased. Because the blue phase appears only in a small temperature range, a liquid crystal composition in which greater than or equal to 5 weight % of a chiral agent is mixed is used for the liquid crystal layer 4008 in order to improve the temperature range. The liquid crystal composition including liquid crystal exhibiting a blue phase and a chiral agent has a response speed as high as 10 µs to 100 µs and are optically isotropic; therefore, alignment treatment is unnecessary, and viewing angle dependence is small.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a color layer and an electrode layer used for a display element are provided on the inner surface of the substrate in that order; however, the polarizing plate may be provided on the inner surface of the substrate. The stacked structure of the polarizing plate and the color layer is also not limited to that described in this embodiment and may be appropriately set depending on materials of the polarizing plate and the color layer or conditions of manufacturing steps. In addition, a light-blocking film which functions as a black matrix may be provided.

In this embodiment, in order to reduce surface unevenness of the thin film transistors and to improve reliability of the thin film transistors, the thin film transistors are covered with a protective layer or the insulating layers (the insulating layer 4020 and the insulating layer 4021) which function as planarizing insulating layers. Note that the protective layer is provided to prevent entry of a contaminant impurity such as an organic substance, a metal substance, or moisture floating in air and is preferably a dense film. As the protective layer, a single layer or a stacked layer of any of a silicon oxide film, a silicon nitride film, a silicon oxynitride film, a silicon nitride oxide film, an aluminum oxide film, an aluminum nitride film, an aluminum oxynitride film, or an aluminum nitride oxide film may be formed by a sputtering method. In this embodiment, an example in which the protective layer is formed by a sputtering method is described; however, there is no particular limitation on a method, and various kinds of methods may be used.

Here, the insulating layer 4020 having a stacked structure is formed as the protective layer. Here, a silicon oxide film is formed by a sputtering method, as a first layer of the insulating layer 4020. When the silicon oxide film is used as the protective layer, the silicon oxide film has an effect of preventing a hillock of an aluminum film used as a source electrode layer and a drain electrode layer.

An insulating layer is formed as a second layer of the protective layer. Here, a silicon nitride film is formed by a sputtering method, as a second layer of the insulating layer 4020. The use of the silicon nitride film as the protective layer can prevent mobile ions of sodium or the like from entering a semiconductor region so that variation in electric characteristics of a TFT can be suppressed.

After the protective layer is formed, annealing (300° C. to 400° C.) of the semiconductor layer may be performed.

The insulating layer 4021 is formed as the planarizing insulating layer. An organic material having heat resistance, such as polyimide, acrylic, benzocyclobutene, polyamide, or epoxy can be used for the insulating layer 4021. In addition to such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed of these materials.

Note that a siloxane-based resin is a resin formed using a siloxane-based material as a starting material and having the bond of Si—O—Si. As for the siloxane-based resin, an organic group (e.g., an alkyl group or an aryl group) or a fluoro group may be used as a substituent. The organic group may include a fluoro group.

A method for forming the insulating layer 4021 is not particularly limited, and the following method can be used depending on the material of the insulating layer 4021: a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, or the like. When the insulating layer 4021 is formed using material liquid, annealing (300° C. to 400° C.) of the semiconductor layer may be performed in a baking step at the same time. A baking step of the insulating layer 4021 also serves as the annealing of the semiconductor layer, whereby a semiconductor device can be formed efficiently.

The pixel electrode layer 4030 and the counter electrode layer 4301 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed using a conductive composition preferably has a light transmittance of greater than or equal to 70% at a wavelength of 550 nm. Further, the resistivity of the conductive polymer included in the conductive composition is preferably less than or equal to 0.1Ω·cm.

As the conductive polymer, a so-called π-electron conjugated conductive polymer can be used. As examples thereof, polyaniline or a derivative thereof, polypyrrole or a derivative thereof, polythiophene or a derivative thereof, a copolymer of more than two kinds of them, and the like can be given.

Further, a variety of signals and potentials are supplied to the signal line driver circuit 4003 which is formed separately, the scan line driver circuit 4004, and the pixel portion 4002 from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the thin film transistors 4010 and 4011.

The connection terminal electrode 4015 is electrically connected to a terminal of the FPC 4018 through an anisotropic conductive film 4019.

FIGS. 16A1, 16A2, and 16B illustrate an example in which the signal line driver circuit 4003 is formed separately and mounted on the first substrate 4001, but this embodiment is not limited to this structure. The scan line driver circuit may be separately formed and then mounted, or only part of the signal line driver circuit or part of the scan line driver circuit may be separately formed and then mounted.

Figure 17:
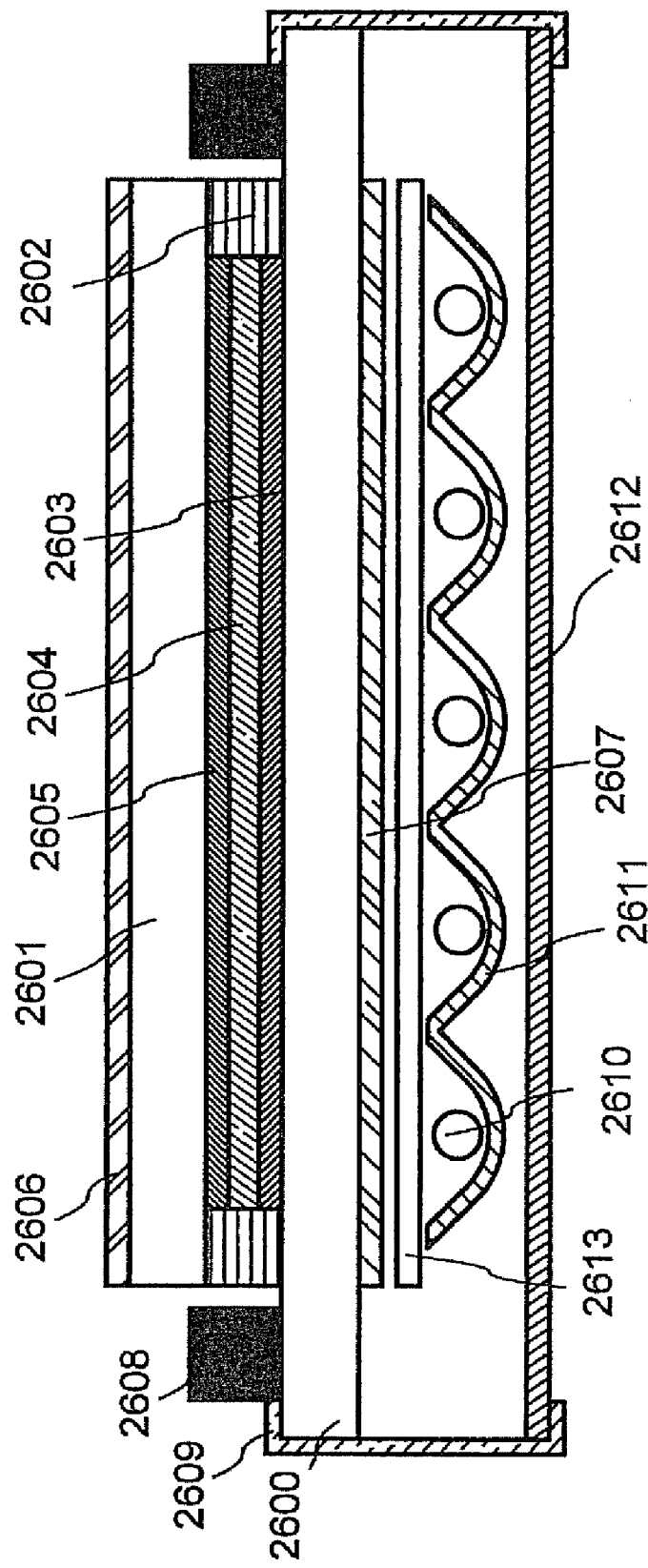
FIG. 17 is a view illustrating an example of a semiconductor device according to Embodiment 6.

FIG. 17 illustrates an example in which a TFT substrate 2600 is used for a liquid crystal display module corresponding to one mode of a semiconductor device.

FIG. 17 illustrates an example of a liquid crystal display module, in which the TFT substrate 2600 and a counter substrate 2601 are fixed to each other with a sealing material 2602, and a pixel portion 2603 including a TFT and the like, a display element 2604 including a liquid crystal layer, and a color layer 2605 are provided between the substrates to form a display region. The color layer 2605 is necessary to perform a color display. In the case of the RGB system, color layers corresponding to colors of red, green, and blue are provided for corresponding pixels. A polarizing plate 2606 is provided on the outer side of the counter substrate 2601, while a polarizing plate 2607 and a diffusion plate 2613 are provided on the outer side of the TFT substrate 2600. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit and a power supply circuit. The polarizing plate and the liquid crystal layer may be stacked with a retardation plate interposed therebetween.

For the liquid crystal display module, a twisted nematic (TN) mode, an In-Plane-Switching (IPS) mode, an fringe field switching (FFS) mode, a Multi-domain Vertical Alignment (MVA) mode, a patterned vertical alignment (PVA) mode, an Axially Symmetric aligned Micro-cell (ASM) mode, an optically compensated birefringence (OCB) mode, a ferroelectric liquid crystal (FLC) mode, an antiferroelectric liquid crystal (AFLC) mode, or the like can be used.

Through this process, a highly reliable liquid crystal display device as a semiconductor device can be manufactured.

This embodiment can be combined with any structure disclosed in other embodiments, as appropriate.

Embodiment 7

In this embodiment, electronic paper is described as an example of a semiconductor device which is one mode of the present invention.

Figure 18:
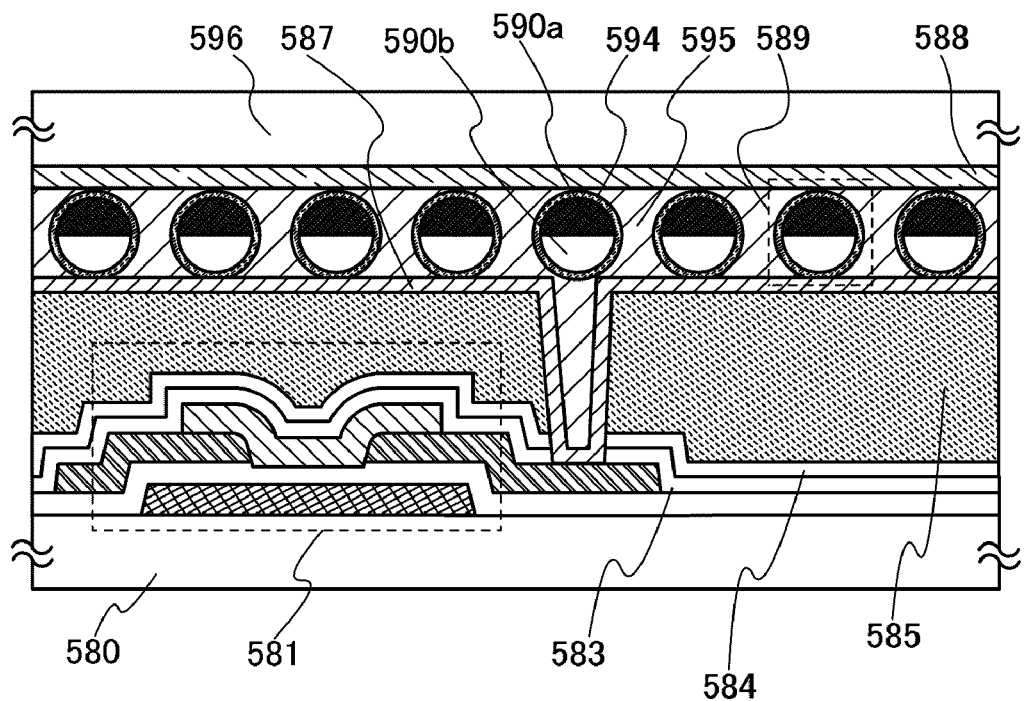
FIG. 18 is a view illustrating an example of a semiconductor device according to Embodiment 7.

FIG. 18 illustrates active matrix electronic paper as an example of the semiconductor device. A thin film transistor 581 used for the semiconductor device can be formed in a manner similar to the thin film transistor described in any of Embodiments 1 to 3.

The electronic paper in FIG. 18 is an example of a display device using a twisting ball display system. The twisting ball display system refers to a method in which spherical particles each colored in black and white are arranged between a first electrode layer and a second electrode layer which are used for a display element, and a potential difference is generated between the first electrode layer and the second electrode layer to control orientation of the spherical particles, so that display is performed.

The thin film transistor 581 provided over a substrate 580 is a thin film transistor having a bottom gate structure. A source electrode layer or a drain electrode layer is electrically connected to a first electrode layer 587 through a contact hole formed in insulating layers 583, 584, and 585. Between the first electrode layer 587 and a second electrode layer 588, spherical particles 589 each including a black region 590a and a white region 590b, and a cavity 594 filled with liquid around the black region 590a and the white region 590b are provided. The circumference of each of the spherical particles 589 is provided with a filler 595 such as a resin (see FIG. 18). In FIG. 18, the first electrode layer 587 corresponds to a pixel electrode, and the second electrode layer 588 corresponds to a common electrode. The second electrode layer 588 is electrically connected to a common potential line provided on the same substrate as the thin film transistor 581. A common connection portion described in the above embodiment is used, whereby the second electrode layer 588 provided on a substrate 596 and the common potential line can be electrically connected to each other through the conductive particles arranged between a pair of substrates.

Further, instead of the twist ball, an electrophoretic element can also be used. In that case, a microcapsule having a diameter of approximately 10 μm to 20 μm, in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element, and is called electronic paper in general. The electrophoretic display element has higher reflectance than a liquid crystal display element, and thus, an assistant light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

In this manner, highly reliable electronic paper can be formed as a semiconductor device.

This embodiment can be combined with the structure disclosed in other embodiments, as appropriate.

Embodiment 8

In this embodiment, a light-emitting display device is described as an example of a semiconductor device which is one mode of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, the latter as an inorganic EL element.

In an organic EL element, by application of a voltage to a light-emitting element, electrons and holes are separately injected from a pair of electrodes into a layer containing a light-emitting organic compound, and a current flows. The electrons and holes (i.e., carriers) are recombined, and thus, the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion type inorganic EL element and a thin-film inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 19:
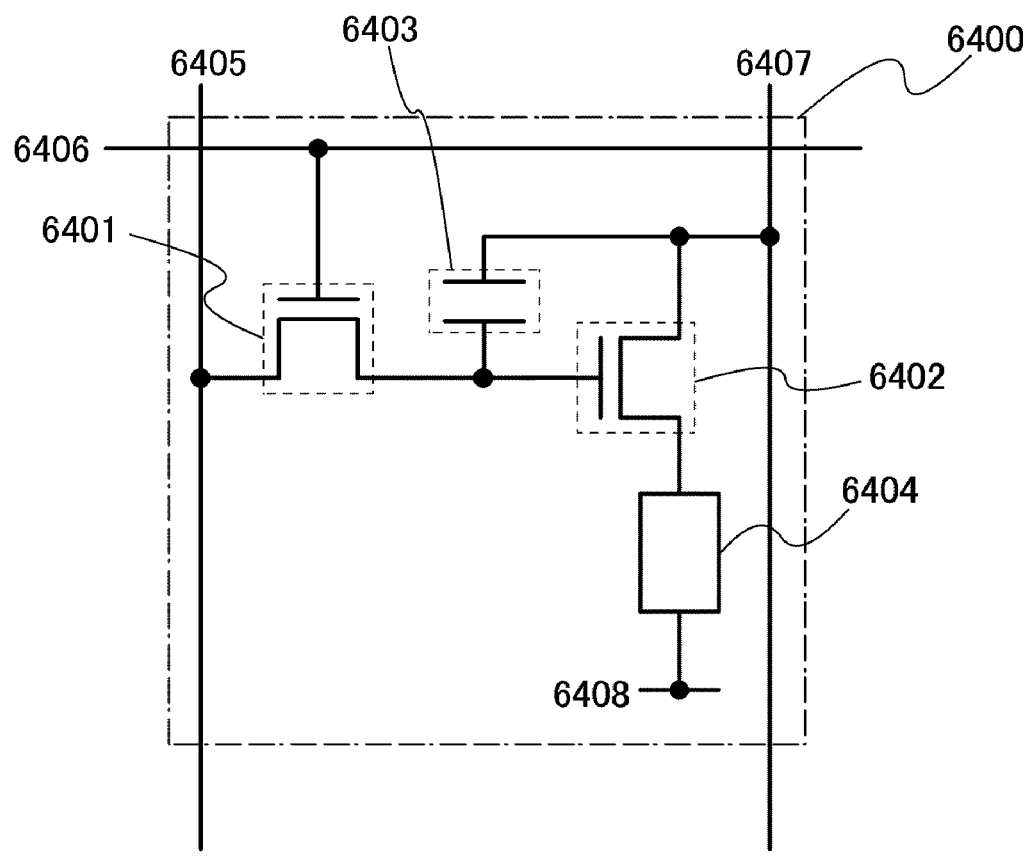
FIG. 19 is a diagram of an example of a pixel equivalent circuit of a semiconductor device according to Embodiment 8.

FIG. 19 illustrates an example of a pixel structure to which digital time grayscale driving can be applied, as an example of a semiconductor device which is one mode of the present invention.

A structure and an operation of a pixel to which digital time grayscale driving can be applied are described. Here, an example is described in which two n-channel transistors using an oxide semiconductor layer (In—Ga—Zn—O-based non-single-crystal film) for a channel formation region are used in one pixel.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408.

The second electrode of the light-emitting element 6404 (the common electrode 6408) is set to a low power supply potential. The low power supply potential is a potential satisfying the low power supply potential<a high power supply potential with the high power supply potential set to the power supply line 6407 as a reference. As the low power supply potential, GND, 0 V, or the like may be employed, for example. A potential difference between the high power supply potential and the low power supply potential is applied to the light-emitting element 6404, and a current is supplied to the light-emitting element 6404. Here, in order to make the light-emitting element 6404 emit light, each potential is set so that the potential difference between the high power supply potential and the low power supply potential is a forward threshold voltage or higher.

Gate capacitance of the driving transistor 6402 may be used as a substitute for the capacitor 6403, so that the capacitor 6403 can be omitted. The gate capacitance of the driving transistor 6402 may be formed between a channel formation region and the gate electrode.

In the case of using a voltage-input voltage driving method, a video signal is input to the gate of the driving transistor 6402 to make the driving transistor 6402 completely turn on or off. That is, the driving transistor 6402 operates in a linear region, and thus, a voltage higher than the voltage of the power supply line 6407 is applied to the gate of the driving transistor 6402. Note that a voltage higher than or equal to (power supply line voltage+$V_{th}$ of the driving transistor 6402) is applied to the signal line 6405.

In the case of using an analog grayscale method instead of the digital time grayscale method, the same pixel structure as in FIG. 19 can be employed by inputting signals in a different way.

In the case of using the analog grayscale method, a voltage higher than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to allow the driving transistor 6402 to operate in a saturation region, a current can flow in the light-emitting element 6404. In order to allow the driving transistor 6402 to operate in the saturation region, the potential of the power supply line 6407 is higher than a gate potential of the driving transistor 6402. Since the video signal is an analog signal, a current in accordance with the video signal flows in the light-emitting element 6404, and the analog grayscale method can be performed.

Note that the pixel structure is not limited to that illustrated in FIG. 19. For example, the pixel illustrated in FIG. 19 can further include a switch, a resistor, a capacitor, a transistor, a logic circuit, or the like.

Next, structures of the light-emitting element will be described with reference to FIGS. 20A to 20C. A cross-sectional structure of a pixel will be described by taking an n-channel driving TFT as an example. Driving TFTs 7001, 7011, and 7021 used for semiconductor devices illustrated in FIGS. 20A to 20C can be manufactured in a manner similar to the thin film transistor described in the above embodiment and are highly reliable thin film transistors each including an In—Ga—Zn—O-based non-single-crystal film.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element having a top emission structure will be described with reference to FIG. 20A.

Figure 20A:
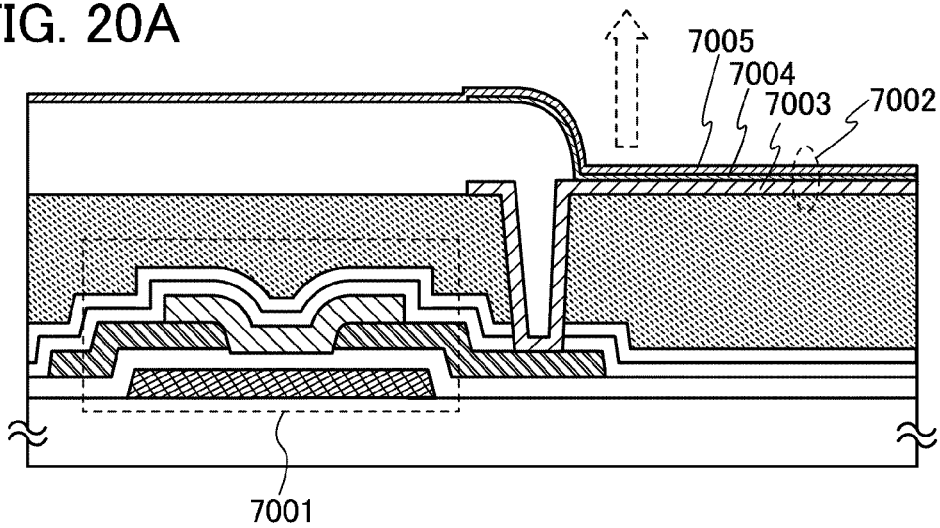
FIGS. 20A to 20C are views each illustrating an example of a semiconductor device according to Embodiment 8.

FIG. 20A is a cross-sectional view of a pixel in the case where the driving TFT 7001 is of an n-type and light is emitted from a light-emitting element 7002 to an anode 7005 side. In FIG. 20A, a cathode 7003 of the light-emitting element 7002 is electrically connected to the driving TFT 7001, and a light-emitting layer 7004 and the anode 7005 are sequentially stacked over the cathode 7003. The cathode 7003 can be made of a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by sequentially stacking an electron-injecting layer, an electron-transporting layer, a light-emitting layer, a hole-transporting layer, and a hole-injecting layer over the cathode 7003. Not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 20A, light is emitted from the light-emitting element 7002 to the anode 7005 side as indicated by an arrow.

Next, a light-emitting element having a bottom emission structure will be described with reference to FIG. 20B. FIG. 20B is a cross-sectional view of a pixel in the case where the driving TFT 7011 is of an n-type and light is emitted from a light-emitting element 7012 to a cathode 7013 side. In FIG. 20B, the cathode 7013 of the light-emitting element 7012 is formed over a light-transmitting conductive layer 7017 which is electrically connected to the driving TFT 7011, and a light-emitting layer 7014 and an anode 7015 are sequentially stacked over the cathode 7013. A light-blocking film 7016 for reflecting or blocking light may be formed to cover the anode 7015 when the anode 7015 has a light-transmitting property. For the cathode 7013, various materials can be used, like in the case of FIG. 20A, as long as they are conductive materials having a low work function. Note that the cathode 7013 is formed to have a thickness that can transmit light (preferably, approximately 5 nm to 30 nm). For example, an aluminum film having a thickness of 20 nm can be used as the cathode 7013. Similarly to the case of FIG. 20A, the light-emitting layer 7014 may be formed using either a single layer or a plurality of layers stacked. The anode 7015 is not required to transmit light, but can be made of a light-transmitting conductive material like in the case of FIG. 20A. As the light-blocking film 7016, metal or the like which reflects light can be used for example; however, it is not limited to a metal film. For example, a resin or the like to which black pigments are added can also be used.

The light-emitting element 7012 corresponds to a region where the cathode 7013 and the anode 7015 sandwich the light-emitting layer 7014. In the case of the pixel illustrated in FIG. 20B, light is emitted from the light-emitting element 7012 to the cathode 7013 side as indicated by an arrow.

Next, a light-emitting element having a dual emission structure will be described with reference to FIG. 20C. In FIG. 20C, a cathode 7023 of a light-emitting element 7022 is formed over a light-transmitting conductive layer 7027 which is electrically connected to the driving TFT 7021, and a light-emitting layer 7024 and an anode 7025 are sequentially stacked over the cathode 7023. Like in the case of FIG. 20A, the cathode 7023 can be made of a variety of conductive materials as long as they have a low work function. Note that the cathode 7023 is formed to have a thickness that can transmit light. For example, a film of Al having a thickness of 20 nm can be used as the cathode 7023. Like in FIG. 20A, the light-emitting layer 7024 may be formed using either a single layer or a plurality of layers stacked. The anode 7025 can be made of a light-transmitting conductive material like in the case of FIG. 20A.

The light-emitting element 7022 corresponds to a region where the cathode 7023, the light-emitting layer 7024, and the anode 7025 overlap with one another. In the case of the pixel illustrated in FIG. 20C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 20B:
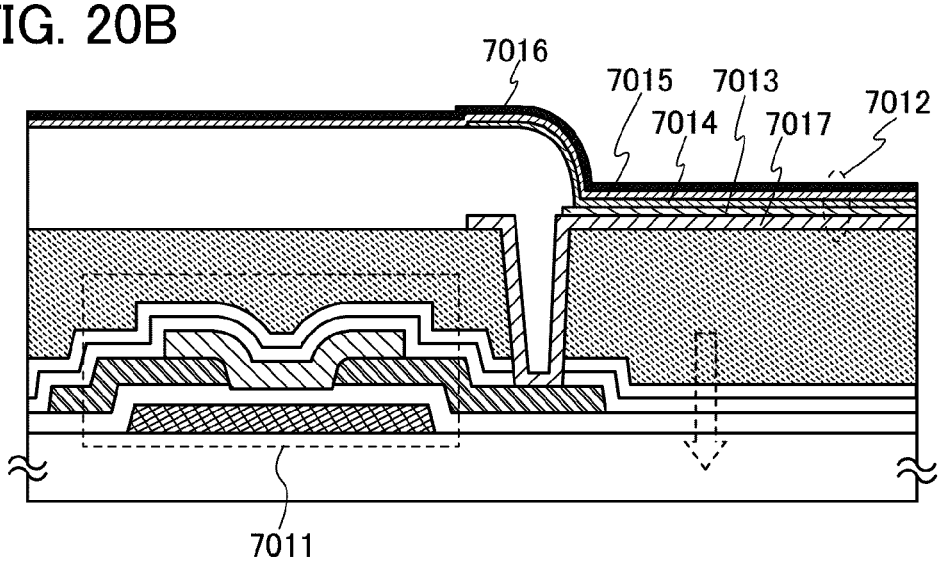
Figure 20C:
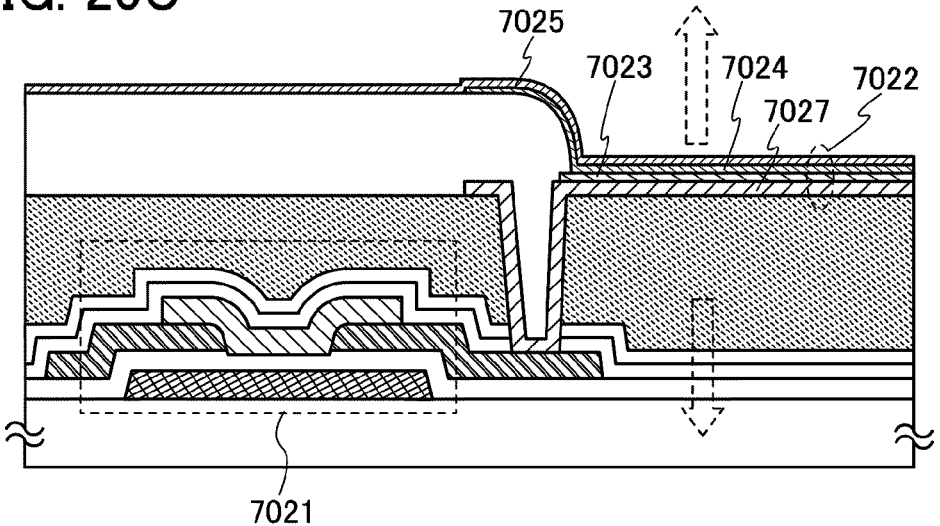

The structure of the semiconductor device described in this embodiment is not limited to those illustrated in FIGS. 20A to 20C and can be modified in various ways.

Figure 21A:
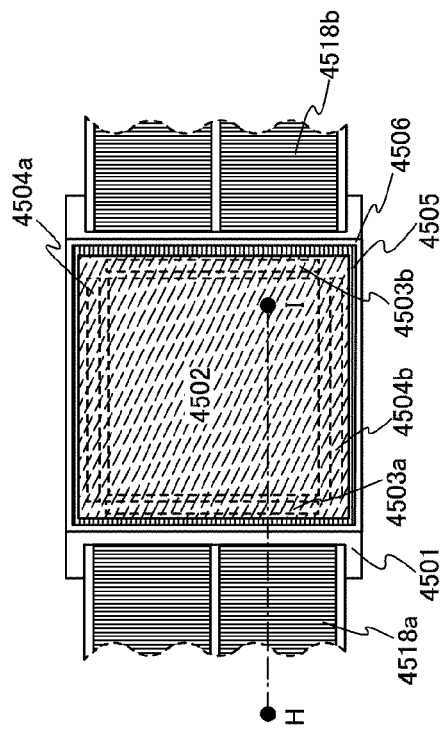
FIGS. 21A and 21B are views illustrating an example of a semiconductor device according to Embodiment 8.
Figure 21B:
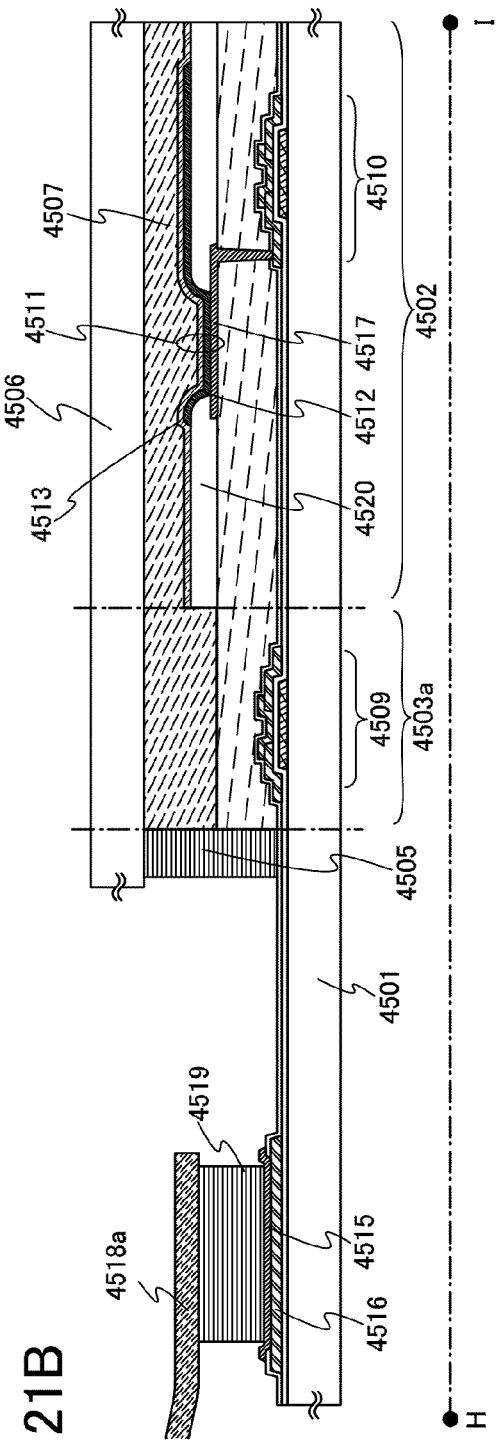

Next, the appearance and cross section of a light-emitting display panel (also referred to as a light-emitting panel) which corresponds to one embodiment of the semiconductor device will be described with reference to FIGS. 21A and 21B. FIG. 21A is a top view of a panel in which highly reliable thin film transistors 4509 and 4510 in which an In—Ga—Zn—O-based non-single-crystal film is included as a semiconductor layer, which are formed over a first substrate 4501 and a light-emitting element 4511 are sealed between the first substrate 4501 and a second substrate 4506 with the sealing material 4505. FIG. 21B corresponds to a cross-sectional view taken along line H-I of FIG. 21A.

The sealing material 4505 is provided to surround a pixel portion 4502, signal line driver circuits 4503a and 4503b, and scan line driver circuits 4504a and 4504b, which are provided over the first substrate 4501. In addition, the second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealing material 4505, and the second substrate 4506. It is preferable that packaging (sealing) be performed with a protective layer (e.g., an attachment film or an ultraviolet curable resin film) which has high airtightness and causes less degasification, or a covering material, in order to prevent further exposure to the outside air.

The pixel portion 4502, the signal line driver circuits 4503a and 4503b, and the scan line driver circuits 4504a and 4504b which are formed over the first substrate 4501 each include a plurality of thin film transistors, and the thin film transistor 4510 included in the pixel portion 4502 and the thin film transistor 4509 included in the signal line driver circuit 4503a are illustrated as an example in FIG. 21B.

As the thin film transistors 4509 and 4510, the highly reliable thin film transistor which includes an In—Ga—Zn—O-based non-single-crystal film as a semiconductor layer, can be employed. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or drain electrode layer of the thin film transistor 4510. Note that a structure of the light-emitting element 4511 is not limited to the stacked structure described in this embodiment, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition wall 4520 is made of an organic resin layer, an inorganic insulating layer, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective layer may be formed over the second electrode layer 4513 and the partition wall 4520 in order to prevent oxygen, hydrogen, moisture, carbon dioxide, or the like from entering into the light-emitting element 4511. As the protective layer, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive layer as the first electrode layer 4517 included in the light-emitting element 4511, and a terminal electrode 4516 is formed using the same conductive layer as the source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 21A and 21B.

Through the above process, a highly reliable light-emitting display device (display panel) as a semiconductor device can be manufactured.

This embodiment can be combined with the structure disclosed in other embodiments, as appropriate.

Embodiment 9

A semiconductor device of one embodiment of the present invention can be applied to electronic paper. The electronic paper can be used for electronic devices in a variety of fields as long as they can display data. For example, the electronic paper can be applied to an e-book reader (electronic book), a poster, an advertisement in a vehicle such as a train, or displays of various cards such as a credit card. Examples of the electronic devices are illustrated in FIGS. 22A and 22B and FIG. 23.

Figure 22A:
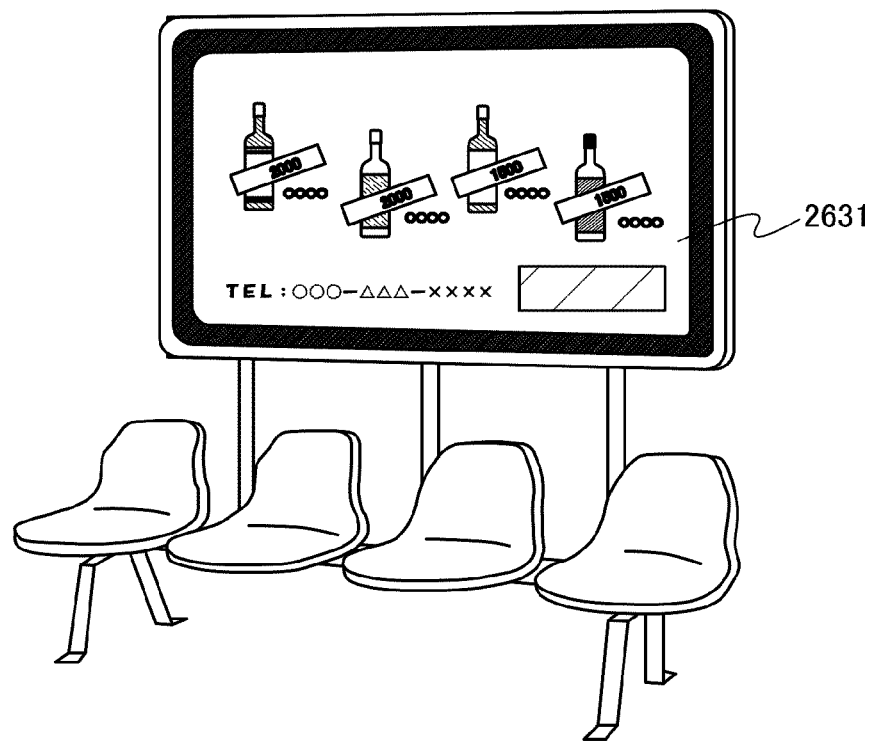
FIGS. 22A and 22B are drawings each illustrating an example of a usage pattern of electronic paper.

FIG. 22A illustrates a poster 2631 using electronic paper. In the case where an advertising medium is printed paper, the advertisement is replaced by hands; however, by using the electronic paper, the advertising display can be changed in a short time. Furthermore, stable images can be obtained without display defects. Note that the poster may have a structure capable of wirelessly transmitting and receiving data.

Figure 22B:
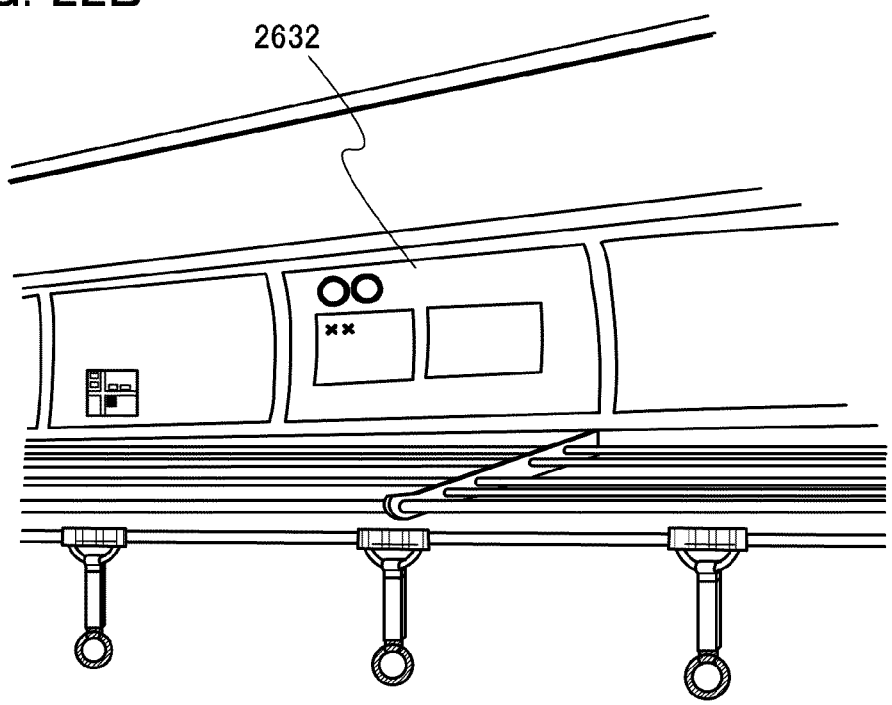

FIG. 22B illustrates an advertisement 2632 in a vehicle such as a train. In the case where an advertising medium is printed paper, the advertisement is replaced by hands; however, by using electronic paper, the advertising display can be changed in a short time with less manpower. Furthermore, stable images can be obtained without display defects. Note that the advertisement in a vehicle may have a structure capable of wirelessly transmitting and receiving data.

Figure 23:
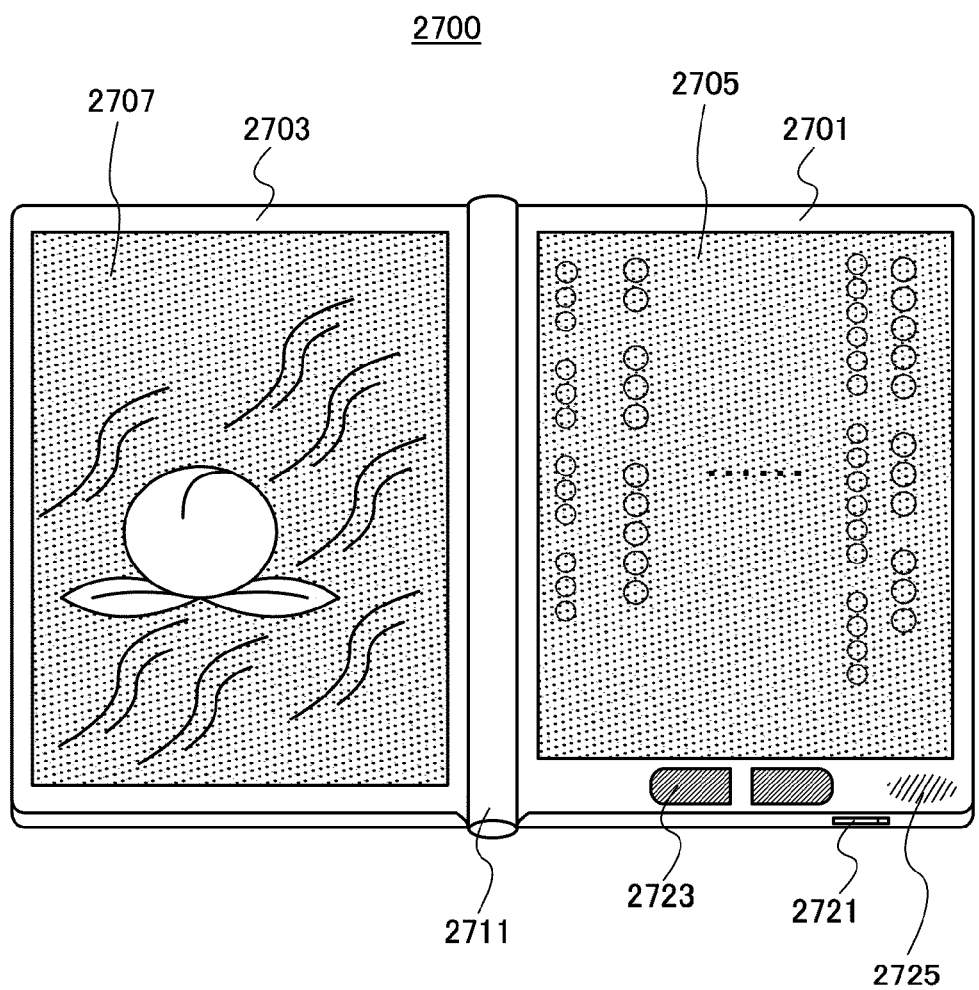
FIG. 23 is an external view illustrating an example of an e-book reader.

FIG. 23 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 23) and graphics can be displayed on a display portion on the left side (the display portion 2707 in FIG. 23).

FIG. 23 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an e-book server.

Embodiment 10

A semiconductor device of one mode of the present invention can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 24A:
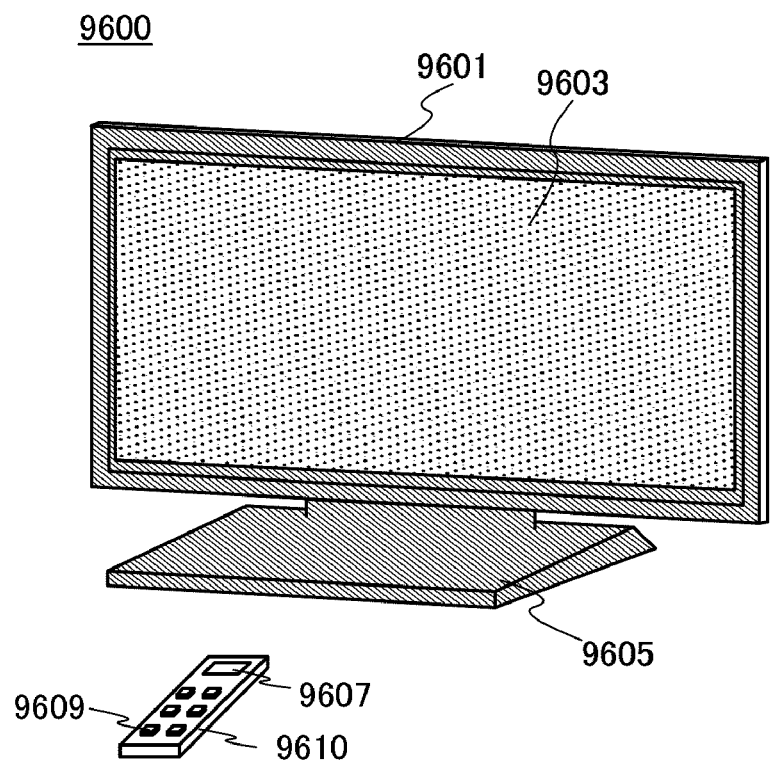
FIG. 24A is an external view illustrating an example of a television device and FIG. 24B is an external view illustrating an example of a digital photo frame.

FIG. 24A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 24B:
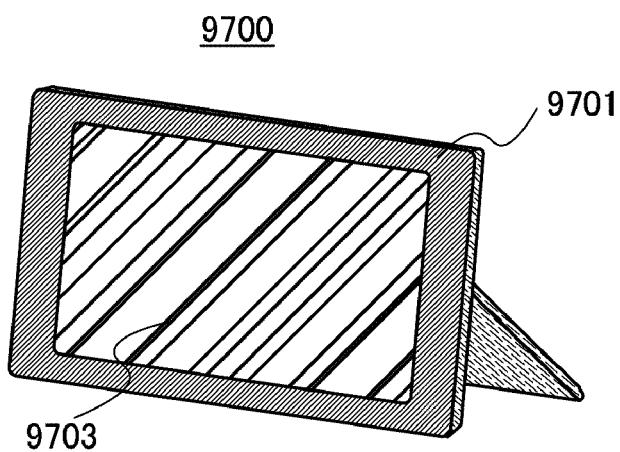

FIG. 24B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a structure capable of wirelessly transmitting and receiving data. Through wireless communication, desired image data can be downloaded to be displayed.

Figure 25A:
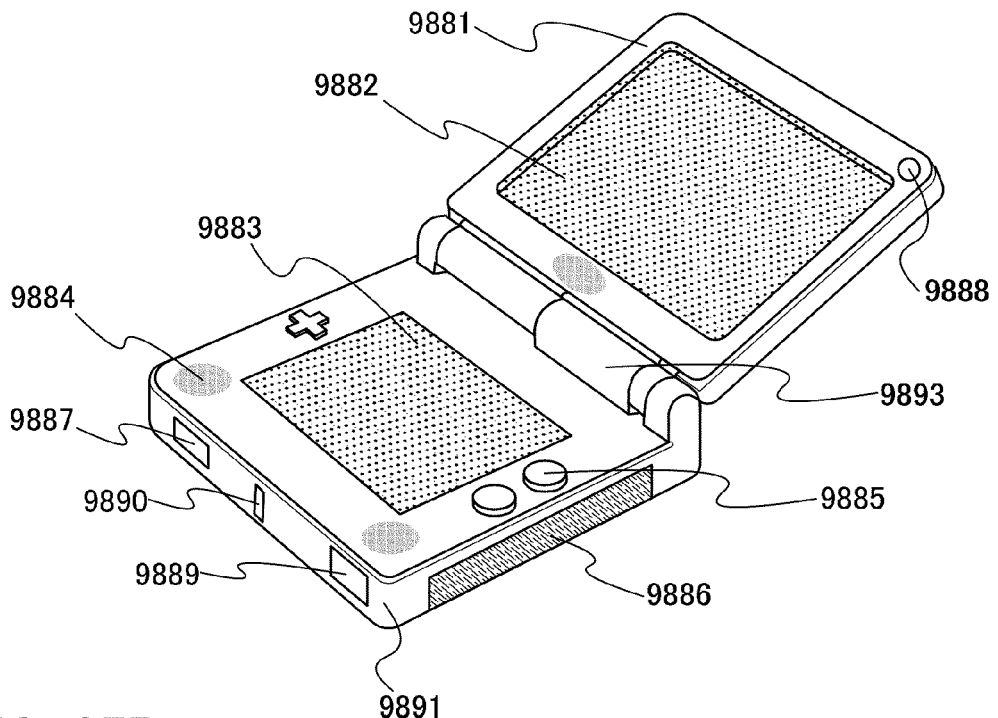
FIGS. 25A and 25B are external views each illustrating an example of a game machine.

FIG. 25A is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 25A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device may be employed. The portable amusement machine may include other accessory equipment, as appropriate. The portable amusement machine illustrated in FIG. 25A has a function of reading a program or data stored in a recording medium to display it on the display portion, and a function of sharing information with another portable amusement machine by wireless communication. The portable amusement machine illustrated in FIG. 25A can have various functions without limitation to the above.

Figure 25B:
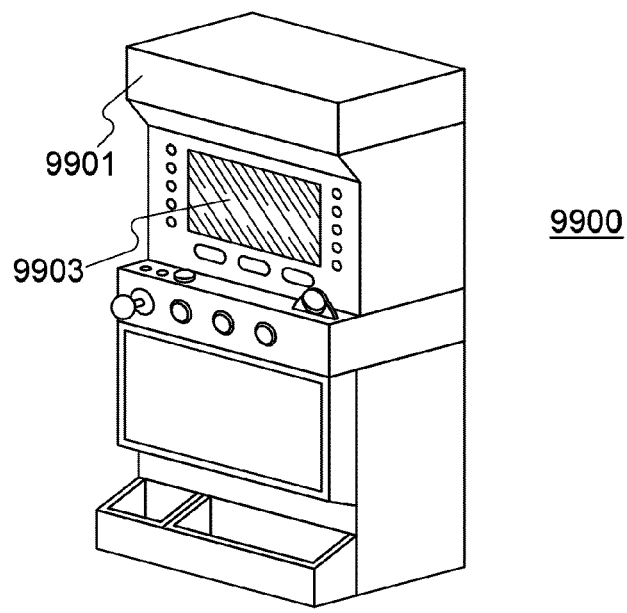

FIG. 25B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of one embodiment of the present invention may be employed. The slot machine 9900 may include other accessory equipment, as appropriate.

Figure 26A:
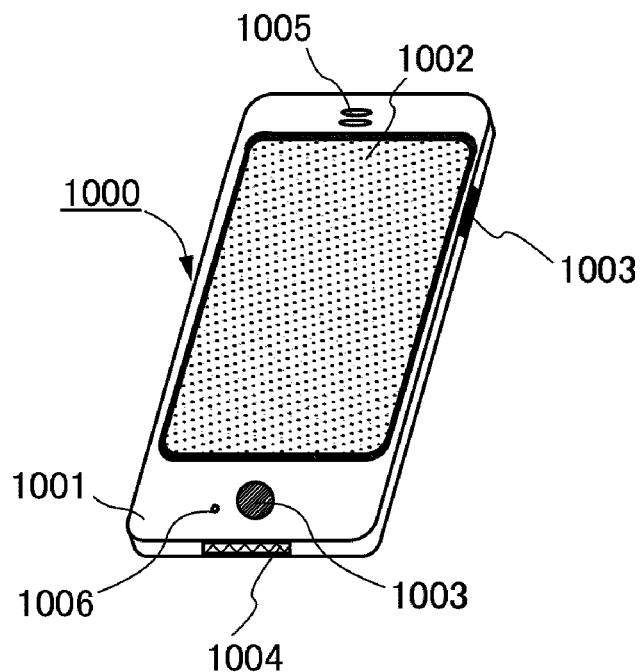
FIGS. 26A and 26B are external views each illustrating an example of a cellular phone.

FIG. 26A illustrates an example of a cellular phone 1000. The cellular phone 1000 is provided with a display portion 1002 incorporated in a housing 1001, an operation button 1003, an external connection port 1004, a speaker 1005, a microphone 1006, and the like.

When the display portion 1002 of the cellular phone 1000 illustrated in FIG. 26A is touched with a finger or the like, data can be input into the cellular phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen mode is switched by touching the display portion 1002 or operating the operation buttons 1003 of the housing 1001. Alternatively, the screen mode may be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period while a signal is detected by the optical sensor in the display portion 1002, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Furthermore, by providing a backlight or sensing light source emitting a near-infrared light for the display portion, an image of a finger vein, a palm vein, or the like can also be taken.

Figure 26B:
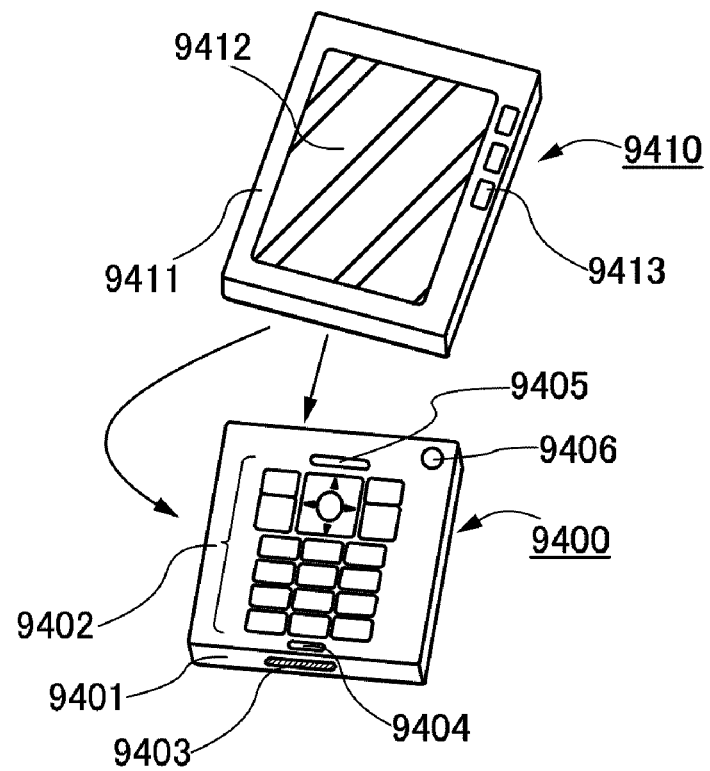

FIG. 26B also illustrates an example of a cellular phone. The cellular phone illustrated in FIG. 26B has a display device 9410 including a display portion 9412 and operation buttons 9413 in a housing 9411 and a communication device 9400 including operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by the arrows. Accordingly, the display device 9410 and the communication device 9400 can be attached to each other along their short sides or long sides. In addition, in a case where only the display function is needed, the display device 9410 is detached from the communication device 9400 so that the display device 9410 can be used by itself. The communication device 9400 and the display device 9410 are capable of sending and receiving images or input data by a wireless communication or wired communication. The communication device 9400 and the display device 9410 each have a rechargeable battery.

This application is based on Japanese Patent Application serial No. 2008-286577 filed with Japan Patent Office on Nov. 7, 2008, the entire contents of which are hereby incorporated by reference.

What is claimed is:

1. A semiconductor device comprising:
    a gate electrode layer over a substrate;
    a gate insulating layer over the gate electrode layer;
    a source electrode layer and a drain electrode layer which overlap with part of the gate electrode layer with the gate insulating layer interposed therebetween; and
    an oxide semiconductor layer over the gate electrode layer and in contact with the gate insulating layer located in a region between the source electrode layer and the drain electrode layer, wherein the oxide semiconductor layer is provided over the source electrode layer and the drain electrode layer and,
    wherein a thickness of the gate insulating layer which is over the gate electrode layer and is located in the region between the source electrode layer and the drain electrode layer is smaller than a thickness of the gate insulating layer provided between the gate electrode layer and at least one of the source electrode layer and the drain electrode layer.

2. A semiconductor device comprising:
    a gate electrode layer over a substrate;
    a first insulating layer over the gate electrode layer;
    a second insulating layer over the first insulating layer, wherein the second insulating layer overlaps with part of the gate electrode layer;
    a source electrode layer and a drain electrode layer which overlap with the part of the gate electrode layer with the first insulating layer and the second insulating layer interposed therebetween; and
    an oxide semiconductor layer over the gate electrode layer and in contact with the first insulating layer located in a region between the source electrode layer and the drain electrode layer, wherein the oxide semiconductor layer is provided over the source electrode layer and the drain electrode layer.

3. The semiconductor device according to claim 2, wherein a thickness of the first insulating layer which is over the gate electrode layer and is located in the region between the source electrode layer and the drain electrode layer is smaller than a thickness of the first insulating layer provided between the gate electrode layer and at least one of the source electrode layer and the drain electrode layer.

4. A semiconductor device comprising:
    a gate electrode layer over a substrate;
    a first insulating layer and a second insulating layer which are sequentially stacked over the gate electrode layer;
    a source electrode layer and a drain electrode layer which overlap with part of the gate electrode layer, with the first insulating layer and the second insulating layer interposed therebetween; and
    an oxide semiconductor layer over the gate electrode layer and in contact with the second insulating layer located in a region between the source electrode layer and the drain electrode layer, wherein the oxide semiconductor layer is provided over the source electrode layer and the drain electrode layer,
    wherein a thickness of the second insulating layer which is over the gate electrode layer and is located in the region between the source electrode layer and the drain electrode layer is smaller than a thickness of the second insulating layer provided between the gate electrode layer and at least one of the source electrode layer and the drain electrode layer.

5. The semiconductor device according to claim 1, wherein the oxide semiconductor layer is provided over the source electrode layer and the drain electrode layer with a buffer layer interposed therebetween.

6. The semiconductor device according to claim 2, wherein the oxide semiconductor layer is provided over the source electrode layer and the drain electrode layer with a buffer layer interposed therebetween.

7. The semiconductor device according to claim 4, wherein the oxide semiconductor layer is provided over the source electrode layer and the drain electrode layer with a buffer layer interposed therebetween.

8. The semiconductor device according to claim 1, wherein end portions of the source electrode layer and the drain electrode layer have tapered shapes.

9. The semiconductor device according to claim 2, wherein end portions of the source electrode layer and the drain electrode layer have tapered shapes.

10. The semiconductor device according to claim 4, wherein end portions of the source electrode layer and the drain electrode layer have tapered shapes.

11. The semiconductor device according to claim 8, wherein a taper angle of each end portion of the source electrode layer and the drain electrode layer is greater than or equal to 20° and less than 90°.

12. The semiconductor device according to claim 9, wherein a taper angle of each end portion of the source electrode layer and the drain electrode layer is greater than or equal to 20° and less than 90°.

13. The semiconductor device according to claim 10, wherein a taper angle of each end portion of the source electrode layer and the drain electrode layer is greater than or equal to 20° and less than 90°.

14. The semiconductor device according to claim 1, wherein upper end portions of the source electrode layer and the drain electrode layer have curved surface shapes.

15. The semiconductor device according to claim 2, wherein upper end portions of the source electrode layer and the drain electrode layer have curved surface shapes.

16. The semiconductor device according to claim 4, wherein upper end portions of the source electrode layer and the drain electrode layer have curved surface shapes.

17. The semiconductor device according to claim 14, wherein a radius of curvature of each upper end portion of the source electrode layer and the drain electrode layer is $1/100$ or more and $1/2$ or less of a thickness of the one of the source electrode layer and the drain electrode layer.

18. The semiconductor device according to claim 15, wherein a radius of curvature of each upper end portion of the source electrode layer and the drain electrode layer is $1/100$ or more and $1/2$ or less of a thickness of the one of the source electrode layer and the drain electrode layer.

19. The semiconductor device according to claim 16, wherein a radius of curvature of each upper end portion of the source electrode layer and the drain electrode layer is $1/100$ or more and $1/2$ or less of a thickness of the one of the source electrode layer and the drain electrode layer.

20. The semiconductor device according to claim 1, wherein the oxide semiconductor layer includes at least one selected from group consisting of indium, gallium, and zinc.

21. The semiconductor device according to claim 2, wherein the oxide semiconductor layer includes at least one selected from group consisting of indium, gallium, and zinc.

22. The semiconductor device according to claim 4, wherein the oxide semiconductor layer includes at least one selected from group consisting of indium, gallium, and zinc.

* * * * *